(12) United States Patent
Oguz et al.

(10) Patent No.: US 11,257,613 B2
(45) Date of Patent: Feb. 22, 2022

(54) SPIN ORBIT TORQUE (SOT) MEMORY DEVICES WITH ENHANCED TUNNEL MAGNETORESISTANCE RATIO AND THEIR METHODS OF FABRICATION

(71) Applicant: Intel Corporation, Santa Clara, CA (US)

(72) Inventors: Kaan Oguz, Portland, OR (US); Tanay Gosavi, Hillsboro, OR (US); Sasikanth Manipatruni, Portland, OR (US); Charles Kuo, Hillsboro, OR (US); Mark Doczy, Beaverton, OR (US); Kevin O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 15/942,434

(22) Filed: Mar. 31, 2018

(65) Prior Publication Data

US 2019/0304653 A1    Oct. 3, 2019

(51) Int. Cl.
| | | |
|---|---|---|
| *H01F 10/32* | (2006.01) |
| *H01F 41/30* | (2006.01) |
| *G11C 11/16* | (2006.01) |
| *H01L 43/12* | (2006.01) |
| *H01L 27/22* | (2006.01) |
| *H01L 43/08* | (2006.01) |
| *H01L 43/10* | (2006.01) |

(52) U.S. Cl.
CPC .......... *H01F 10/329* (2013.01); *G11C 11/161* (2013.01); *H01F 10/3254* (2013.01); *H01F 10/3286* (2013.01); *H01F 41/302* (2013.01); *H01L 27/228* (2013.01); *H01L 43/08* (2013.01); *H01L 43/12* (2013.01); *H01F 10/3272* (2013.01); *H01L 43/10* (2013.01)

(58) Field of Classification Search
CPC ............... H01F 10/329; H01F 10/3286; H01F 10/3254; H01F 41/302; H01F 10/3268; H01F 41/307; G11C 11/161; H01L 43/12; H01L 27/228; H01L 43/08; H01L 43/10; H01L 43/02
See application file for complete search history.

(56) References Cited

U.S. PATENT DOCUMENTS

| | | | | |
|---|---|---|---|---|
| 6,057,049 A | * | 5/2000 | Fuke | B82Y 25/00 428/700 |
| 10,283,701 B1 | * | 5/2019 | Ikhtiar | H01F 41/14 |
| 2004/0150017 A1 | * | 8/2004 | Tsang | B82Y 10/00 257/295 |
| 2005/0174836 A1 | * | 8/2005 | Sharma | G11C 11/15 365/171 |

(Continued)

*Primary Examiner* — Karen Kusumakar
*Assistant Examiner* — Adam S Bowen
(74) *Attorney, Agent, or Firm* — Essential Patents Group, LLP

(57) ABSTRACT

A perpendicular spin orbit torque (SOT) memory device includes an electrode having a spin orbit torque material, where the SOT material includes iridium and manganese and a perpendicular magnetic tunnel junction (pMTJ) device on a portion of the electrode. The pMTJ device includes a free magnet structure electrode, a fixed layer and a tunnel barrier between the free layer and the fixed layer and a SAF structure above the fixed layer. The Ir—Mn SOT material and the free magnet have an in-plane magnetic exchange bias.

20 Claims, 15 Drawing Sheets

(56) References Cited

U.S. PATENT DOCUMENTS

| | | | |
|---|---|---|---|
| 2008/0273375 A1* | 11/2008 | Dahmani | G11C 11/16 365/158 |
| 2016/0163965 A1* | 6/2016 | Han | G01K 7/36 257/467 |
| 2016/0225423 A1* | 8/2016 | Naik | H01L 27/228 |
| 2018/0114898 A1* | 4/2018 | Lee | G11C 11/1675 |
| 2018/0219152 A1* | 8/2018 | Apalkov | H01F 10/3286 |
| 2019/0081234 A1* | 3/2019 | Naik | H01L 43/08 |
| 2020/0273864 A1 | 8/2020 | Manipatruni et al. | |
| 2020/0273866 A1 | 8/2020 | Manipatruni et al. | |
| 2020/0273867 A1 | 8/2020 | Manipatruni et al. | |
| 2020/0303343 A1 | 9/2020 | Manipatruni et al. | |
| 2020/0303344 A1 | 9/2020 | Manipatruni et al. | |
| 2020/0321344 A1 | 10/2020 | Ramamoorthy et al. | |
| 2020/0321472 A1 | 10/2020 | Ramamoorthy et al. | |
| 2020/0321473 A1 | 10/2020 | Ramamoorthy et al. | |
| 2020/0321474 A1 | 10/2020 | Ramamoorthy et al. | |
| 2021/0202507 A1 | 7/2021 | Thareja et al. | |
| 2021/0202510 A1 | 7/2021 | Thareja et al. | |
| 2021/0202689 A1 | 7/2021 | Thareja et al. | |
| 2021/0202690 A1 | 7/2021 | Thareja et al. | |
| 2021/0203324 A1 | 7/2021 | Manipatruni et al. | |
| 2021/0203325 A1 | 7/2021 | Manipatruni et al. | |
| 2021/0203326 A1 | 7/2021 | Manipatruni et al. | |
| 2021/0226636 A1 | 7/2021 | Manipatruni et al. | |

* cited by examiner

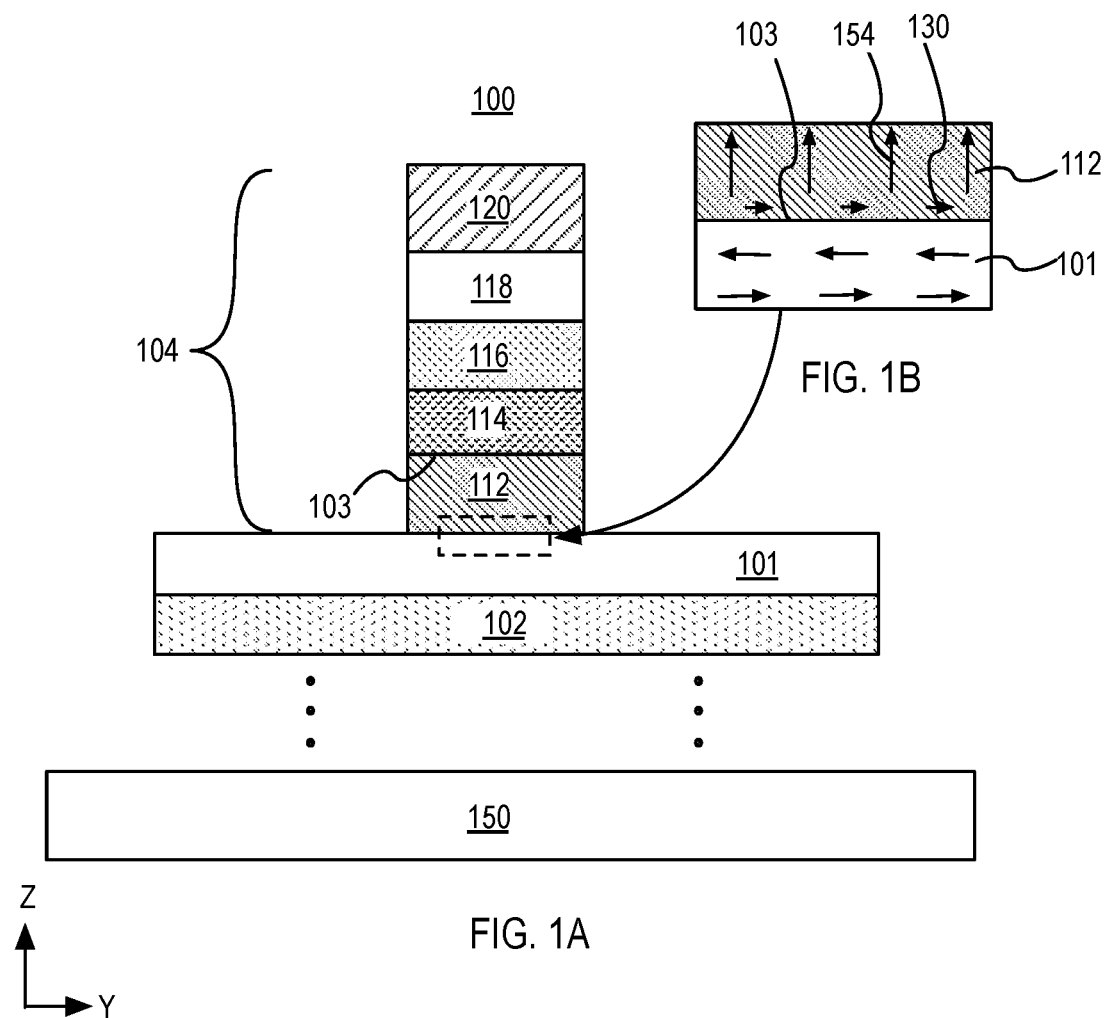
FIG. 1A
FIG. 1B
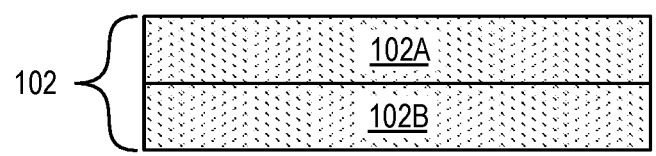
FIG. 1C

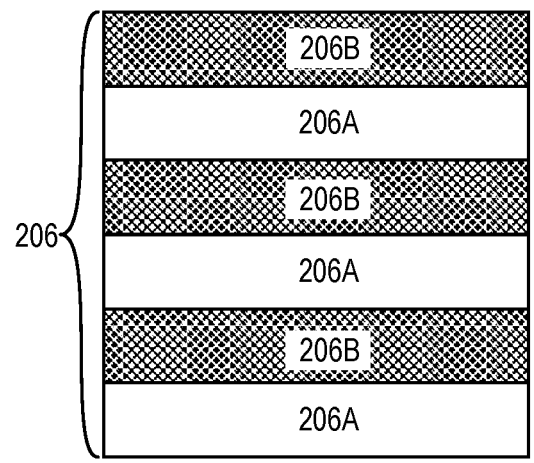
FIG. 2B
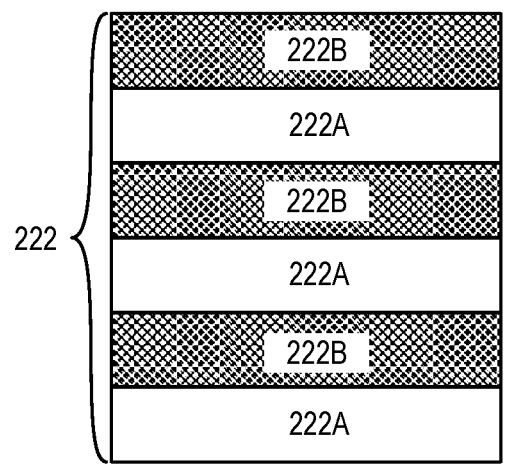 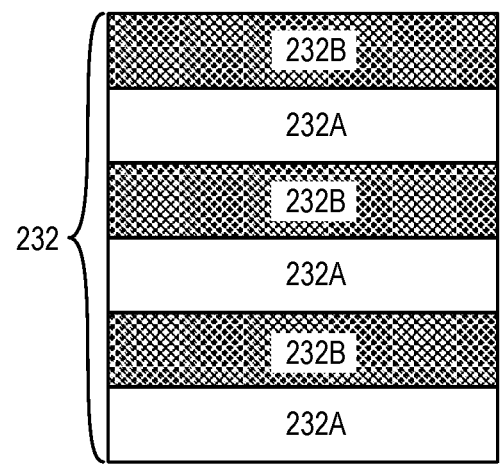
FIG. 2C  FIG. 2D

SPIN ORBIT TORQUE (SOT) MEMORY DEVICES WITH ENHANCED TUNNEL MAGNETORESISTANCE RATIO AND THEIR METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, increasing tunneling magnetoresistance (TMR) ratio while increasing thermal stability in SOT memory devices are some important areas of process development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1A illustrates a cross-sectional view of a spin orbit torque (SOT) memory device, in accordance with an embodiment of the present disclosure.

FIG. 1B illustrates an enhanced cross-sectional view of the in-plane exchange bias in a portion of the free magnet at an interface between the free magnet and the SOT electrode.

FIG. 1C illustrates a cross-sectional view of a seed layer structure.

FIG. 2B illustrates a cross-sectional view of alternating stack of layers of magnetic and non-magnetic materials in a magnetic stability enhancement structure.

FIG. 2C illustrates a cross-sectional view of alternating stack of layers of magnetic and non-magnetic materials in a magnetic structure.

FIG. 2D illustrates a cross-sectional view of alternating stack of layers of magnetic and non-magnetic materials in a magnetic structure.

DESCRIPTION OF THE EMBODIMENTS

Figure 1D:
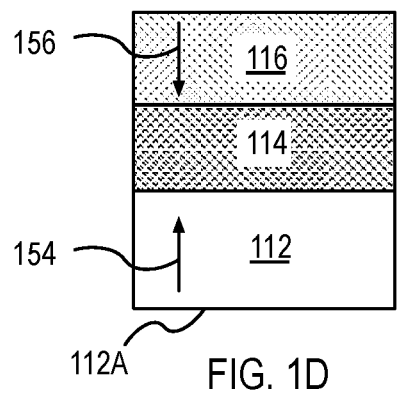
FIG. 1D illustrates a cross-sectional view depicting a direction of magnetization in a free magnet that is anti-parallel to a direction of magnetization in a fixed magnet, in accordance with an embodiment of the present disclosure.

Spin orbit torque (SOT) memory devices with enhanced TMR ratio and methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

A SOT memory device may include a magnetic tunnel junction (MTJ) device formed on an electrode including a SOT material (herein referred to as a spin orbit torque electrode). The MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a plane of the free magnet. Resistance switching is brought about in a pMTJ device by passing a critical amount of spin polarized current through the pMTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when there is no current flowing through the pMTJ device. For this reason, the MTJ device belongs to a class of memory known as non-volatile memory.

As an pMTJ device is further scaled down in size, the amount of critical spin polarized current density required to switch the device increases. By implementing an MTJ device on a SOT electrode, the magnetization in the free magnet can switch with a torque provided by a Spin Hall current, induced by passing an electrical current in a transverse direction, through the SOT electrode. The Spin Hall current arises from spin dependent scattering of electrons due to a phenomenon known as spin orbit interaction.

Electrons of one spin polarity are directed towards an upper portion of the SOT electrode and electrons with an opposite spin polarity are directed toward a bottom portion of the SOT electrode. Electrons of a particular spin polarity are diffused toward the free magnet of the MTJ device and impart a spin orbit torque on the magnetization of the free magnet. The spin hall current can also help the MTJ device to switch faster. It is to be appreciated that, in an embodiment, the spin hall current can switch a free magnet having a magnetization that is oriented in an in-plane direction, even in the absence of a spin polarized current passing through the MTJ device. An in-plane direction is defined as a direction that is parallel to an uppermost surface of the SOT electrode. To fully utilize the effect of a Spin Hall current and spin torque transfer current, an external magnetic field may be required to provide an-plane symmetry breaking component. The external magnetic field may be applied in a direction parallel to the plane of the SOT electrode layer. By implementing a pMTJ with a ferromagnetically coupled free magnet on an antiferromagnetic layer such as a SOT electrode an in-plane exchange bias may be formed in the free magnet at an interface between the free magnet and the SOT electrode. Such an exchange bias may provide an-plane symmetry breaking component.

In accordance with embodiments of the present disclosure, a spin orbit torque (SOT) memory device includes an electrode having a SOT material, where the SOT material includes iridium and manganese. The SOT memory device further includes a material layer stack for a magnetic tunnel junction (MTJ) device on the electrode. In an embodiment, the first electrode has uppermost surface area that is 10-20 times larger than a lowermost surface area of the MTJ device. In an embodiment, the MTJ device includes a free magnet structure that further includes a magnetic enhancement layer including a magnetic material, a free magnet and a spacer between magnetic enhancement layer and the free magnet, wherein the free magnet is coupled with the magnetic enhancement layer. The spacer enables ferromagnetic coupling between the magnetic enhancement layer and the free magnet. The free magnet structure collectively undergoes magnetization switching. The MTJ device further includes a fixed magnet having a magnetization that does not change orientation during operation of the SOT memory device, a tunnel barrier between the free magnet and the fixed magnet and a second electrode on the fixed magnet.

The material layer stack of the SOT memory device has a TMR ratio of at least 90% TMR ratio due to CoFeB/MgO interface crystallization. Interface crystallization may be optimized by tuning the magnetic enhancement layer and the coupling layer materials in the free magnet structure. A TMR of greater than 90% advantageously provides practical applications of an SOT memory device.

FIG. 1A is an illustration of a cross-sectional view of a SOT memory device 100 in accordance with an embodiment of the present disclosure. The SOT memory device 100 includes an SOT electrode 101 having a SOT material (herein referred to as a SOT electrode 101), where the SOT material includes iridium and manganese. The SOT memory device 100 further includes a material layer stack for a magnetic tunnel junction (MTJ) device 104 on the SOT electrode 101. In some embodiments, such as in the illustrative embodiment, the magnetic tunnel junction (MTJ) device 104 is a perpendicular MTJ (pMTJ) device 104. A SOT memory device 100 that includes a pMTJ device 104, is herein referred to as a perpendicular SOT (pSOT) memory device 100. In an embodiment, the material layer stack for a pMTJ device 104 includes a free magnet 112 including a ferromagnetic material that has perpendicular magnetic anisotropy (Z-direction), a tunnel barrier 114 having a material such as an MgO or $Al_2O_3$ on the free magnet 112, a fixed magnet 116 on the tunnel barrier 114 and an electrode 120 above the fixed magnet 116.

The Ir—Mn in SOT electrode 101, for example, has antiferromagnetic properties. The SOT electrode 101 having an antiferromagnetic property and the free magnet 112 having a ferromagnetic property combine to have an exchange bias 130 in the free magnet 112 at an interface 103 between the SOT electrode 101 and the free magnet 112 as illustrated in FIG. 1B. In the illustrative embodiment, the exchange bias 130 is in-plane and directed parallel to the interface 103 and orthogonal to the perpendicular magnetic anisotropy 154 in the free magnet 112. Depending on the strength of the free magnet 112, the exchange bias 130 is in the range of 100-500 Oersted.

Referring again to FIG. 1A, in some embodiments, the SOT material has a face centered tetragonal crystal structure. A face centered tetragonal crystal structure is advantageous for Ir—Mn to have a strong in-plane exchange bias with a free magnet 112. Depending on embodiments, the SOT material has a thickness between 4 nm and 15 nm. In exemplary embodiments, the SOT electrode 101 has a thickness that ranges between 4 nm and 8 nm.

In an embodiment, the pSOT memory device 100 further includes a seed structure 102, adjacent to the first SOT electrode 101, above a substrate 150. The seed structure may have a sheet resistance at least two times greater than a sheet resistance of the anti-ferromagnetic spin orbit torque material. In embodiments, the thickness of the sheet metal is less than a thickness of the SOT electrode 101 to provide a higher sheet resistance compared to a sheet resistance of the SOT electrode 101.

In some examples, the seed structure 102 includes a seed layer 102A and a seed layer 102B on the seed layer 102A as illustrated in FIG. 1C. In some embodiments, the seed layer 102A includes an amorphous metal such as Ta, TaN or TiN. In some such embodiments, seed layer 102B includes an element having an FCC atomic arrangement such as Pt, Pd or Ir. In exemplary embodiments, seed layer 102A has a thickness between 0.5 nm and 1 nm. In exemplary embodiments, seed layer 102B has a thickness between 1 nm and 2 nm. In further embodiments, the seed structure 102 including seed layers 102A and 102B has a combined thickness of seed layers 102A and 102B between 2 nm and 3 nm.

In an embodiment, the free magnet 112 includes a magnetic material such as Co, Ni, Fe or alloys of these materials. In an embodiment, the free magnet 112 includes a magnetic material such as CoB, FeB, CoFe or CoFeB. In some embodiments, the free magnet 112 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 112 is FeB, where the concentration of boron is between 10 and 40 atomic percent of the total composition of the FeB alloy. In an embodiment, the free magnet 112 has a thickness between 0.9 nm and 2.0 nm for pMTJ devices.

In an embodiment, tunnel barrier 114 is composed of a material suitable for allowing electron current having a majority spin to pass through tunnel barrier 114, while impeding, at least to some extent, electron current having a minority spin from passing through tunnel barrier 114. Thus, tunnel barrier 114 (or spin filter layer) may also be referred to as a tunneling layer for electron current of a particular spin orientation. In an embodiment, tunnel barrier 114 includes a material such as, but not limited to, magnesium oxide (comprising predominantly magnesium and oxygen) or aluminum oxide (comprising predominantly aluminum and oxygen). In an embodiment, tunnel barrier 114 including MgO has a crystal orientation that is (001) and is lattice matched to free magnet 112 below tunnel barrier 114 and fixed magnet 116 above tunnel barrier 114. In an embodiment, tunnel barrier 114 is MgO and has a thickness in the range of 1 nm to 2 nm. In an embodiment, a free magnet 112 including a $Co_{100-x-y}Fe_xB_y$, is highly lattice matched to the tunnel barrier 114 including an MgO. Lattice matching a crystal structure of the free magnet 112 with the tunnel barrier 114 enables a higher tunneling magnetoresistance (TMR) ratio in the pMTJ device 104.

In some embodiments, the fixed magnet 116 includes a material and has a thickness sufficient for maintaining a fixed magnetization. In an embodiment, the fixed magnet 116 of the pMTJ device 104 includes an alloy such as CoFe or CoFeB. In an embodiment, the fixed magnet 116 comprises a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the fixed magnet 116 is FeB, where the concentration of boron is between 10 and 40 atomic percent of the total composition of the FeB alloy. In an embodiment the fixed magnet 116 has a thickness that is between 1 nm and 3 nm.

FIG. 1D illustrates a cross-sectional view depicting the free magnet 106 of a pMTJ device 210 having a direction of magnetization (denoted by the direction of the arrow 154) that is perpendicular to a horizontal surface 112A of the free magnet 106. In the illustrative embodiment, the magnetization 154 is anti-parallel to a direction of magnetization (denoted by the direction of the arrow 156) in the fixed magnet 116. When the magnetization 154 in the free magnet 106 is directed opposite (anti-parallel) to the magnetization 156 in the fixed magnet 116, the pMTJ device 104 device is said to be in a high resistance state.

Figure 1E:
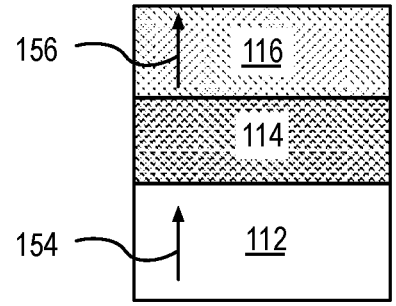
FIG. 1E illustrates a cross-sectional view depicting a direction of magnetization in a free magnet that is parallel to a direction of magnetization in a fixed magnet, in accordance with an embodiment of the present disclosure.

Conversely, FIG. 1E illustrates a cross-sectional view depicting the free magnet 106 of the pMTJ device 104 having a magnetization 154 that is parallel to a direction of magnetization 156 in the fixed magnet 116. When the magnetization 154 in the free magnet 106 is directed parallel to the magnetization 156 in the fixed magnet 116, the pMTJ device 104 is said to be in a low resistance state.

In an embodiment, the free magnet 106 and the fixed magnet 116 can have approximately similar thicknesses and an injected spin polarized current which changes the direction of the magnetization 154 in the free magnet 106 can also affect the magnetization 156 of the fixed magnet 116. In an embodiment, to make the fixed magnet 116 more resistant to accidental flipping the fixed magnet 116 has a higher magnetic anisotropy than the free magnet 106. In another embodiment, a synthetic antiferromagnetic (SAF) structure 118 can be disposed between the electrode 120 and the fixed magnet 116, as illustrated in FIG. 1A, in order to reduce the stray field acting on the free magnet 116.

Figure 1F:
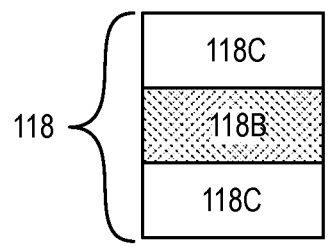
FIG. 1F illustrates a cross-sectional view of individual layers of a synthetic antiferromagnetic structure, in accordance with an embodiment of the present disclosure.

FIG. 1F illustrates cross-sectional view of the SAF structure 118 in an accordance of an embodiment of the present invention. In an embodiment, the SAF structure 118 includes a non-magnetic layer 118B sandwiched between a pinning ferromagnet 118A and a pinning ferromagnet 118C, as depicted in FIG. 1D. The pinning ferromagnet 118A and the pinning ferromagnet 118C are anti-ferromagnetically coupled to each other. In an embodiment, the pinning ferromagnet 118A includes a layer of a magnetic metal comprising Co, Ni, or Fe. Exemplary alloys include CoFe or CoFeB. Other magnetic alloys of one or more of Co, Ni, Fe are also possible, as is a bilayer structure including a magnetic/non-magnetic metals such but not limited to Co/Pd or a Co/Pt. In an embodiment, the non-magnetic layer 118B includes a ruthenium or an iridium layer. In an embodiment, the pinning ferromagnet 118C includes a layer of a magnetic metal comprising Fe, Co or Ni. Exemplary alloys include CoFe or CoFeB. Other magnetic alloys of one or more of Co, Ni, Fe are also possible, as is a bilayer structure including a magnetic/non-magnetic metal such but not limited to Co/Pd or a Co/Pt. In an embodiment, a ruthenium based non-magnetic layer 118B has a thickness between 0.3 nm and 1.0 nm to ensure that the coupling between the pinning ferromagnet 118A and the pinning ferromagnet 118C is anti-ferromagnetic in nature.

It is to be appreciated that an additional layer of non-magnetic spacer layer may exist between the fixed magnet 116 and the SAF structure 118 (not illustrated in FIG. 1A). A non-magnetic spacer layer enables coupling between the SAF structure 118 and the fixed magnet 116. In an embodiment, a non-magnetic spacer layer may include a metal, such as Ta, Ru or Ir. Referring again to FIG. 1A, the pMTJ device 104 further includes an electrode 120 on the SAF structure 118. In an embodiment, the electrode 120 includes a material, such as Ta or TiN. In an embodiment, the electrode 120 has a thickness between 5 nm and 70 nm.

In an embodiment, the substrate 150 includes a suitable semiconductor material such as but not limited to, single crystal silicon, polycrystalline silicon and silicon on insulator (SOI). In some embodiments, the substrate can include a dielectric layer. In another embodiment, substrate 150 includes other semiconductor materials such as germanium, silicon germanium or a suitable group III-N or a group III-V compound. Logic devices such as MOSFET transistors and access transistors and may be formed on the substrate 150. Logic devices such as access transistors may be integrated with memory devices such as SOT memory devices to form embedded memory. Embedded memory including SOT memory devices and logic MOSFET transistors can be combined to form functional integrated circuit such as a system on chip.

Figure 1G:
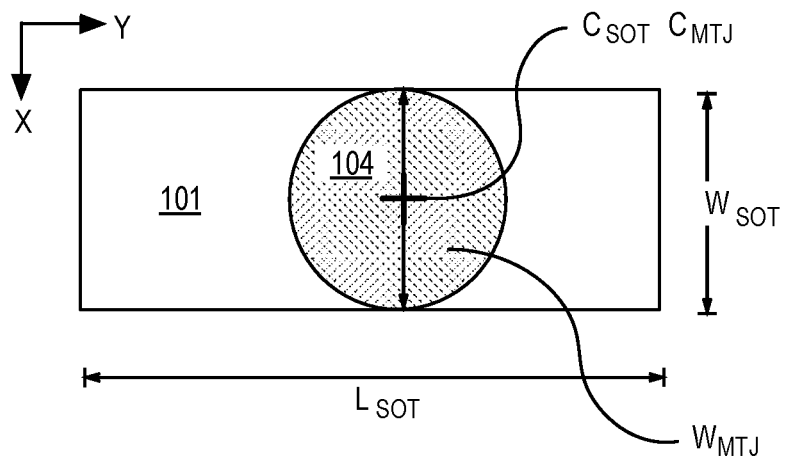
FIG. 1G illustrates a plan view of a magnetic tunnel junction (MTJ) device on a spin orbit torque electrode, in accordance with an embodiment of the present disclosure.

In an embodiment, the pMTJ device 104 is approximately in the center of the SOT electrode 101 as shown in the plan view illustration of FIG. 1G. In the illustrative embodiment, the SOT electrode 101 has a rectangular plan view profile and the pMTJ device 104 has a circular plan view profile as illustrated in FIG. 1B. In another embodiment, the pMTJ device 104 has a plan view profile that is rectangular. In another embodiment, when an MTJ memory device is an in-plane MTJ device, the in-plane MTJ device has a plan view profile that is elliptical. In an embodiment, the SOT electrode 101 has a length, $L_{SOT}$, between 100 nm and 500 nm. In an embodiment, the SOT electrode 101 has a thickness between 2 nm and 10 nm. In an embodiment, the SOT electrode 101 has a width, $W_{SOT}$, between 10 nm and 50 nm. In an embodiment, the pMTJ device 104 has a broadest cross-sectional width, $W_{MTJ}$, that is similar or substantially similar to the width, $W_{SOT}$. In an embodiment, the pMTJ device 104 has a broadest cross sectional width, $W_{MTJ}$, that is between 10 nm and 50 nm.

In an embodiment, the pMTJ device 104 has a center, $C_{MTJ}$ and the SOT electrode 101 has a center, $C_{SOT}$. In an embodiment, $C_{MTJ}$ is aligned to $C_{SOT}$ in X and Y directions, as illustrated in FIG. 1G. In another embodiment, $C_{MTJ}$ is misaligned from the $C_{SOT}$ in the Y-direction. Misalignment may range between 10 nm and 30 nm. The electrical resistivity of the SOT electrode 101 may play a role in positioning of the pMTJ device 104 on the SOT electrode 101 along the Y-direction in FIG. 1B.

Figure 2A:
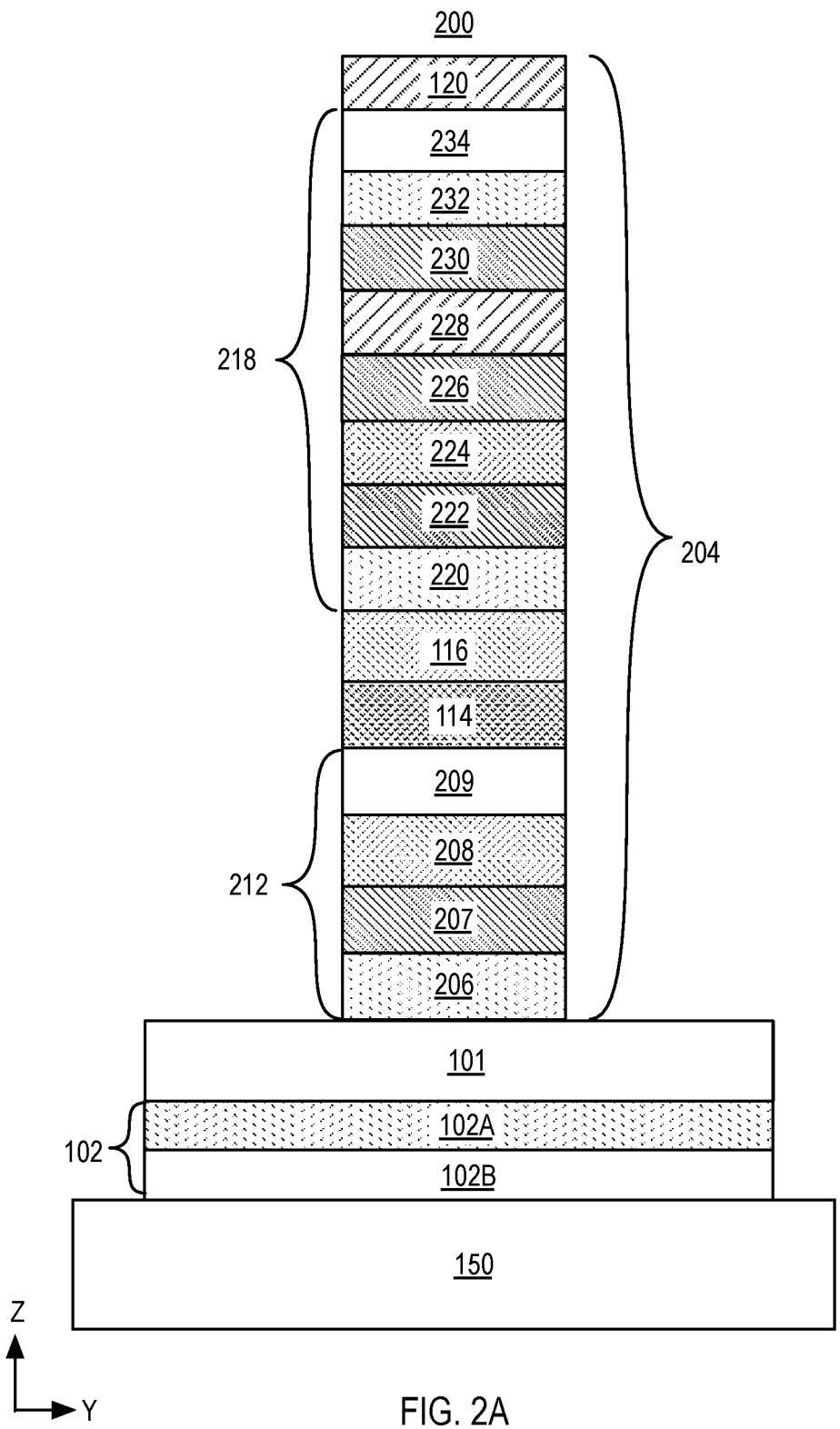
FIG. 2A illustrates a cross-sectional view of a SOT memory device, in accordance with an embodiment of the present disclosure.

FIG. 2A illustrates a cross-sectional view of a pSOT memory device 200, including a pMTJ device 204. In some embodiments, the pSOT memory device 200 has a TMR ratio of at least 90%. The pSOT memory device 200 includes a composite free magnet 212 that includes magnetic stability enhancement structure 206, a ferromagnetic layer 207, a conductive spacer 208 and a free magnet 209. A composite free magnet 212 such as described above has a plurality of interfaces that has thermal stability above 40 kT, and a TMR ratio between 90% and 110%.

In some embodiments, the magnetic stability enhancement structure 206 includes a multilayer stack of alternating layers of magnetic layer 206A and a non-magnetic layer 206B on the magnetic layer 206A as is illustrated in FIG. 2B. The alternating layers of the multilayer stack ranges from at least 2-10 layers of each magnetic layer 206A and nonmagnetic layer 206B, although 3 pairs are shown in FIG. 2B. The non-magnetic layer 206B may include a metal such as platinum, palladium or iridium and magnetic layer 206A may include a magnetic material such as cobalt or nickel. Examples of thicknesses of the non-magnetic layer 206B ranges between 0.2 nm and 1.0 nm and the magnetic layer 206A ranges between 0.2 nm and 1.0 nm. The total combined thickness of the multilayer stack may range between 0.4 nm and 10 nm. When the magnetic stability enhancement structure 206 includes a multilayer stack such as is depicted in FIG. 2B, the magnetic layer 206A is directly adjacent to the spin orbit torque material of SOT electrode 101, and a non-magnetic layer 206B is adjacent to the ferromagnetic layer 207.

Referring once again to FIG. 2A, ferromagnetic layer 207 may include a material such as cobalt or nickel. The ferromagnetic layer 207 may have a thickness that is between 0.4 nm and 0.6 nm. The presence of the ferromagnetic layer 207 adjacent to the conductive spacer 208 increases an interfacial perpendicular anisotropy of the MTJ 204.

The conductive spacer 208 may include a metal such as tungsten, molybdenum or tantalum. Depending on embodiments, the conductive spacer 208 has a thickness between 0.2 nm and 1 nm. In some embodiments, a conductive spacer 208 having a thickness between 0.2 nm and 0.5 nm may be discontinuous. In some such embodiments, portions of the free magnet 209 may be in direct contact with the ferromagnetic layer 207. In some embodiments, the material of the free magnet 209 is the same or substantially the same as the material of the free magnet 116. In an exemplary embodiment, the free magnet 209 includes a CoFeB.

In some embodiments, as illustrated the pSOT memory device 200 further includes a SAF structure 218. In the illustrative embodiment, the SAF structure 218 includes a non-magnetic spacer 220 above the fixed magnet 116, a magnetic structure 222 including a multilayer stack of alternating layers of magnetic and non-magnetic materials above the non-magnetic spacer 220 and a magnetic layer 224 above the magnetic structure 222. The SAF structure 218 further includes a non-magnetic spacer 226 above the magnetic layer 224, a magnet 228 above the non-magnetic spacer 226, and a non-magnetic spacer layer 230 above the magnet 228. The SAF structure 218 further includes a magnetic structure 232 including a multilayer stack of alternating layers of magnetic and non-magnetic materials above the non-magnetic spacer layer 230 and a non-magnetic spacer 234 above the magnetic structure 232.

The fixed magnet 116 and the magnetic structure 222 and the magnetic layer 224 may be magnetically coupled, for example ferromagnetically coupled. The magnet 228 and the magnetic structure 232 may be ferromagnetically coupled. In the illustrative embodiment, the fixed magnet 116, the magnetic structure 222 and the magnetic layer 224 are anti-ferromagnetically coupled with the magnet 228 and the magnetic structure 232.

In some embodiments, the non-magnetic spacer 220 includes a metal such as tantalum, tungsten, molybdenum ruthenium, iridium. In other embodiments non-magnetic spacer 220 includes an alloy of two or more element such as Ta, W, Mo, Ru or Ir. In an exemplary embodiment the non-magnetic spacer 220 is tantalum. The non-magnetic spacer 220 may have a thickness between 0.2 nm and 1 nm to provide ferromagnetic coupling between the fixed magnet 116 and the magnetic structure 222.

In some embodiments, the magnetic structure 222 includes a multilayer stack of alternating layers of magnetic layer 222A and a non-magnetic layer 222B on the magnetic layer 222A as is illustrated in FIG. 2C. The alternating layers of the multilayer stack may range from 2-10 layers of each magnetic layer 222A and non-magnetic layer 222B, although 3 pairs are shown in FIG. 2C. The non-magnetic layer 222B may include a metal, such as platinum, palladium or iridium. Magnetic layer 222A may include a magnetic material, such as cobalt. Examples of thicknesses of the non-magnetic layer 222B ranges from 0.2-1 nm and the magnetic layer 222A ranges from 0.3-0.5 nm. The total combined thickness of the multilayer stack may range between 4 nm and 10 nm. When the magnetic structure 222 includes a multilayer stack such as is depicted in FIG. 2C, the magnetic layer 222A is directly adjacent to the non-magnetic spacer 220, and a non-magnetic layer 222B is adjacent to the magnetic layer 224.

Referring once again to FIG. 2A, in some embodiments, the magnetic layer 224 is a ferromagnetic material. The ferromagnetic material may include a material, such as cobalt or nickel. The magnetic layer 224 may have a thickness that is between 0.4 nm and 0.6 nm. In some embodiments, the non-magnetic spacer 226 includes a metal such as tantalum, tungsten, molybdenum ruthenium, iridium. In other embodiments non-magnetic spacer 226 includes an alloy of two or more element such as Ta, W, Mo, Ru or Ir. In an exemplary embodiment the non-magnetic spacer 226 is ruthenium. The non-magnetic spacer 226 may have a thickness between 0.2 nm and 1 nm to provide anti ferromagnetic coupling between the magnetic layer 224 and the magnetic structure 222.

In some embodiments, the magnet 228 includes a material that is the same or substantially the same as the material of the magnetic layer 224. In some embodiments, the non-magnetic spacer layer 230 includes a metal such as tantalum, ruthenium, platinum or palladium. In an exemplary embodiment the non-magnetic spacer layer 230 is platinum. The non-magnetic spacer layer 230 may have a thickness between 0.2 nm and 1 nm to provide ferromagnetic coupling between the magnet 228 and the magnetic structure 232. In an exemplary embodiment, the non-magnetic spacer layer 230 has a thickness between 0.5 nm and 0.7 nm.

In some embodiments, the magnetic structure 232 includes a multilayer stack of alternating layers of magnetic layer 232A and a non-magnetic layer 232B on the magnetic layer 232A as is illustrated in FIG. 2D. The alternating layers of the multilayer stack may range from 2 to 10 layers of each magnetic layer 232A and non-magnetic layer 232B, although 3 pairs are shown in FIG. 2D. The non-magnetic layer 232B may include a metal, such as platinum, palladium or iridium. Magnetic layer 232A may include a magnetic material, such as cobalt. Examples of thicknesses of the non-magnetic layer 232B ranges from 0.2-1 nm and the magnetic layer 232A ranges from 0.2 nm-0.5 nm. The total combined thickness of the multilayer stack may range between 4 nm and 10 nm. When the magnetic structure 232 includes a multilayer stack such as is depicted in FIG. 2D, the magnetic layer 232A is directly adjacent to the non-magnetic spacer layer 230, and a non-magnetic layer 232B is adjacent to the non-magnetic spacer 234.

Referring once again to FIG. 2A, in some embodiments, the non-magnetic spacer 234 includes a material that is the same or substantially the same as the material of the non-magnetic spacer 220. In some embodiments, the non-magnetic spacer 234 includes a metal such as tantalum, tungsten, molybdenum ruthenium, iridium. In other embodiments non-magnetic spacer 234 includes an alloy of two or more element such as Ta, W, Mo, Ru or Ir. The non-magnetic spacer 234 may have a thickness between 1 nm and 5 nm. In an exemplary embodiment, the non-magnetic spacer 234 has a thickness of 2 nm.

Figure 3A:
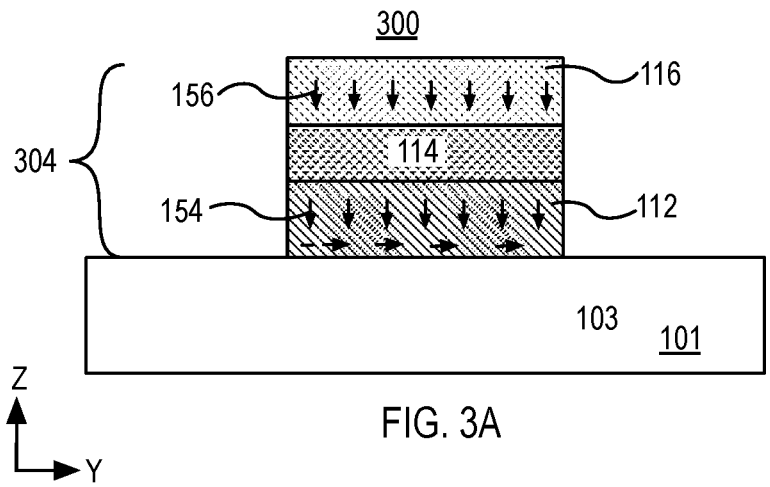
FIG. 3A illustrates a SOT memory device in a low resistance state.
Figure 3B:
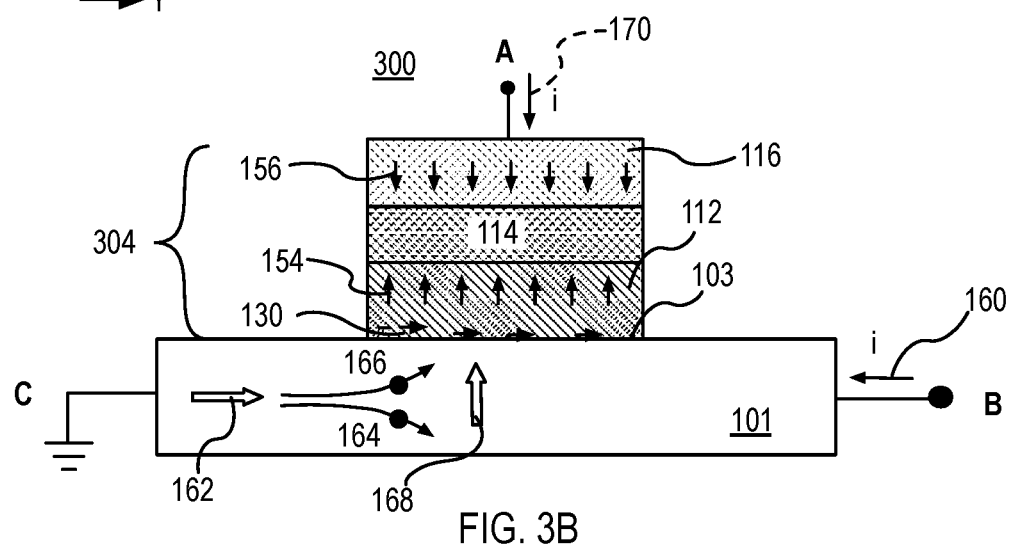
FIG. 3B illustrates a SOT memory device switched to a high resistance state after the application of a spin hall current.
Figure 3C:
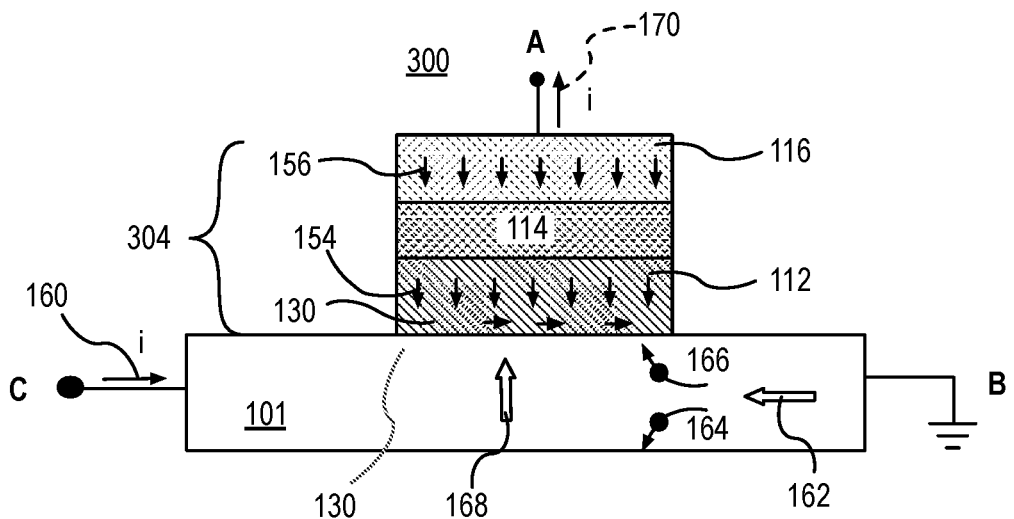
FIG. 3C illustrates a SOT memory device switched to a low resistance state after the application of a spin hall current.

FIGS. 3A-3C illustrate a mechanism for switching a spin orbit torque (SOT) memory device such as a spin orbit torque (SOT) memory device 300 including a pMTJ device 304 on the SOT electrode 101 including a spin orbit torque material. In the illustrative embodiment, the pMTJ device 304 includes some of the features of the pMTJ device 104, such as the free magnet 106, the fixed magnet 116 and the tunnel barrier 114 between the free magnet 106, the fixed magnet 116.

FIGS. 3A-3C illustrate a mechanism for switching a spin orbit torque (SOT) memory device such as a spin orbit torque (SOT) memory device 300 including a pMTJ device 304 on the SOT electrode 101 including a spin orbit torque material. In the illustrative embodiment, the pMTJ device 304 includes some of the features of the pMTJ device 104, such as the free magnet 112, the fixed magnet 116 and the tunnel barrier 114 between the free magnet 112, the fixed magnet 116.

FIG. 3A illustrates a pSOT memory device 300 including the pMTJ device 304 on the SOT electrode 101, where a magnetization 154 of the free magnet 112 is aligned in a direction parallel to the magnetization 156 of the fixed magnet 116. In an embodiment, the direction of magnetization 154 of the free magnet 112 and the direction of magnetization 156 of the fixed magnet 116 are both in the negative Z-direction as illustrated in FIG. 3A. As discussed above, when the magnetization 154 of the free magnet 112 is in a direction parallel to a direction of magnetization 156 of the fixed magnet 116, pMTJ device 104 is in a low resistance state.

FIG. 3B illustrates the pMTJ device 304 of the spin orbit torque (SOT) memory device 300 switched to a high resistance state. In an embodiment, a reversal in the direction of magnetization 154 of the free magnet 112 in FIG. 3B relative to the direction of magnetization 154 of the free magnet 112 in FIG. 3A is brought about (a) by inducing a spin diffusion current 168 in the SOT electrode 101, in the Z-direction and (b) through assistance from an exchange bias 130 in the free magnet at the interface 103 between the SOT electrode 101 and the free magnet 112, in the Y-direction. In some embodiments, a current 170 such as a spin transfer torque (STTM) current 170 may also be sent through pMTJ device 304.

In an embodiment, a charge current 160 is passed through the SOT electrode 101 in the negative Y-direction (by applying a positive voltage at terminal B with respect to a grounded terminal C) as illustrated in FIG. 3B. In response to the charge current 160, an electron current 162 flows in the positive Y-direction. The electron current 162 includes electrons with two opposing spin orientations, a type I electron 166, having a spin oriented in the negative X-direction and a type II electron 164 having a spin oriented in the positive X-direction. In an embodiment, electrons constituting the electron current 162 experience a spin dependent scattering phenomenon in the SOT electrode 101. The spin dependent scattering phenomenon is brought about by a spin-orbit interaction between the nucleus of the atoms in the SOT electrode 101 and the electrons in the electron current 162. The spin dependent scattering phenomenon causes type I electrons 166, whose spins are oriented in the negative X-direction (into the page of FIG. 3B), to be deflected upwards towards an uppermost portion of the SOT electrode 101 and type II electrons 164 whose spins are oriented in the positive X-direction to be deflected downwards towards a lowermost portion of the SOT electrode 101. The separation between the type I electrons 166 and the type II electrons 164 induces a polarized spin diffusion current 168 in the SOT electrode 101. In an embodiment, the spin current 168 is diffused upwards toward the free magnet 112 of the pMTJ device 104, as is depicted in FIG. 3B. The spin current 168 induces a Spin Hall torque on the magnetization 154 of the free magnet 112.

A torque may be exerted on the magnetization 154 of the free magnet 112 by the exchange bias 130 in the Y-direction. In the illustrative embodiment, the exchange bias 130 in the Y-direction provides a torque component (in the positive Z-direction). The combination of Spin Hall torque and torque from exchange bias 130 may switch the magnetization 154 of the free magnet 112 (to a positive Z-direction) as illustrated in FIG. 3B.

As discussed above, in some implementations, an $i_{STTM}$ current 170 may be passed through the MTJ device 304 in the negative Z-direction (by applying a positive voltage at terminal A with respect to a grounded terminal C) as illustrated in FIG. 3B. The $i_{STTM}$ current 170, flowing through the pMTJ device 104 exerts torque on the magnetization 154 of the free magnet 112. A spin transfer torque may assist flipping of magnetization 154 in the free magnet 112 (from the negative Z-direction illustrated in FIG. 3A) to a positive Z-direction illustrated in FIG. 3B.

FIG. 3C illustrates the pMTJ device 304 of the spin orbit torque (SOT) memory device 300 switched to a low resistance state. In an embodiment, a reversal in the direction of magnetization 154 of the free magnet 112 in FIG. 3C compared to the direction of magnetization 154 of the free magnet 112 in FIG. 3B is brought about by (a) a reversal in the direction of the spin diffusion current 168 in the SOT electrode 101, and by (b) torque from the exchange bias 130 in the Y-direction. The direction of the exchange bias 130 is determined by an initialization of the pMTJ 104.

In some implementations, an $i_{STTM}$ current 170 may be passed through the MTJ device 304 in the positive Z-direction to provide torque assisted switching.

FIGS. 4A-4I illustrate cross-sectional views representing various operations in a method of fabricating pSOT memory device, such as the pSOT memory device 100 in accordance with embodiments of the present disclosure.

Figure 4A:
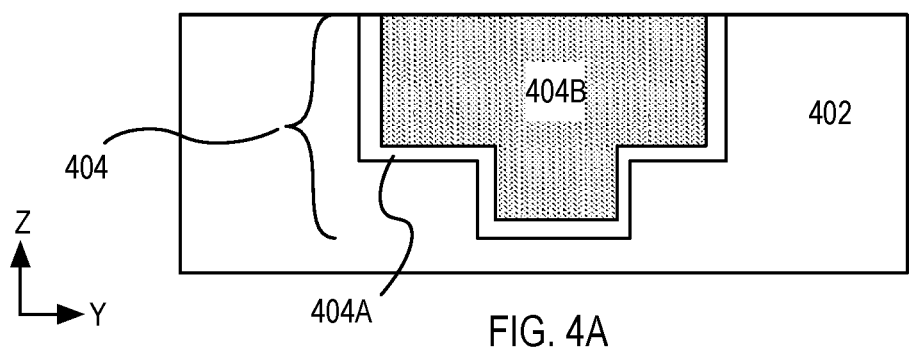
FIG. 4A illustrates a cross-sectional view of conductive interconnect adjacent to a dielectric layer formed above a substrate.

FIG. 4A illustrates a conductive interconnect 404 surrounded by a dielectric layer 402 formed above a substrate. In some embodiments, the conductive interconnect 404 is formed in a dielectric layer 402 by a damascene or a dual damascene process. In an embodiment, the conductive interconnect 404 includes a barrier layer 404A, such as tantalum nitride, and a fill metal 404B, such as copper, tungsten or ruthenium. In an embodiment, the conductive interconnect 404 is fabricated using a subtractive etch process when materials other than copper are utilized. In an embodiment, the dielectric layer 402 includes a material such as but not limited to silicon dioxide, silicon nitride, silicon carbide, or carbon doped silicon oxide. The dielectric layer 402 may have an uppermost surface that is substantially co-planar with an uppermost surface of the conductive interconnect 404, as illustrated. In some examples, the dielectric layer 402 has a total thickness between 70 nm and 300 nm. In some embodiments, conductive interconnect 404 is electrically connected to a circuit element such as a transistor (not shown).

Figure 4B:
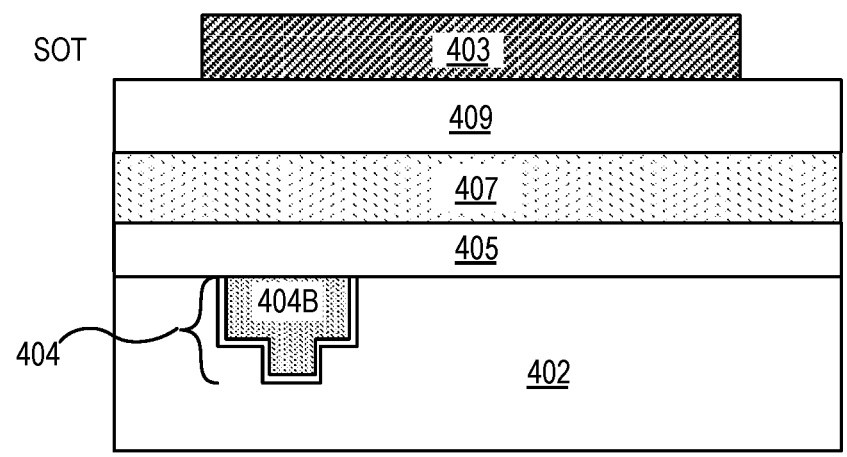
FIG. 4B illustrates a cross-sectional view of the structure in FIG. 4A following the formation of seed layers on a dielectric layer formed above a substrate, following the formation of an electrode layer including a spin orbit torque (SOT) material on an uppermost surface of the seed layers, and following the formation of a mask, in an accordance with embodiments of the present disclosure.

FIG. 4B illustrates a cross-sectional view of the formation of seed layers 405 and 407 above the conductive interconnect 404 and the dielectric layer 402, formation of an electrode layer 409 on the seed layer 407 and the formation of a mask 403 on the electrode layer 409. In an embodiment, the seed layers 405 and 407 include materials that are the same or substantially the same as the materials of the seed layers 102A and 102B, respectively. The seed layers 405 and 407 may be blanket deposited on an uppermost surface of the conductive interconnect 404 and on an uppermost surface of the dielectric layer 402. In some embodiments, the seed layer 405 includes an amorphous metal such as Ta, TaN or TiN. An amorphous metal is advantageous for a subsequent deposition of seed layers 407. Electrode layer 409 may include an element having an FCC atomic arrangement such as Pt, Pd or Ir and templates from an amorphous underlying seed layer 407 during the deposition process to provide an FCC atomic arrangement. In some embodiments, the seed layers 405 and 407 are blanket deposited using a physical vapor deposition process or a plasma enhanced chemical vapor deposition (PECVD) process.

In an embodiment, the electrode layer 409 includes a material that is the same or substantially the same as the material of SOT electrode 101. In an embodiment, the electrode layer 409 includes an alloy of iridium and a metal, such as manganese or platinum. In exemplary embodiments, the electrode layer 409 is IrMn. An IrMn alloy is a material that can generate spin orbit torque in response to an electric current and can also act as an antiferromagnetic material where the spin domains are antiferromagnetically ordered. Antiferromagnetic alignment of domains leads to no net magnetic moment through a volume of the material making the electrode layer 409 antiferromagnetic. In an embodiment, the electrode layer 409 is deposited using a physical vapor deposition process or a plasma enhanced chemical vapor deposition (PECVD) process. The electrode layer 409 may be deposited sequentially after deposition of the seed layer 405 and 407 without breaking vacuum in a cluster processing tool. In some embodiments, the electrode layer 409 has a thickness that is between 4 nm and 15 nm, a thickness range chosen to advantageously provide less sheet resistance than a sheet resistance of each of the seed layers 40 and 407.

In some embodiments, the mask 403 is formed by a lithographic process. In other embodiments, the mask 403 includes a dielectric material that has been patterned. The mask 403 defines a size of an electrode that will subsequently be formed. In some embodiments, the mask 403 has a rectangular shape as is depicted in the plan view illustration of FIG. 1B.

Figure 4C:
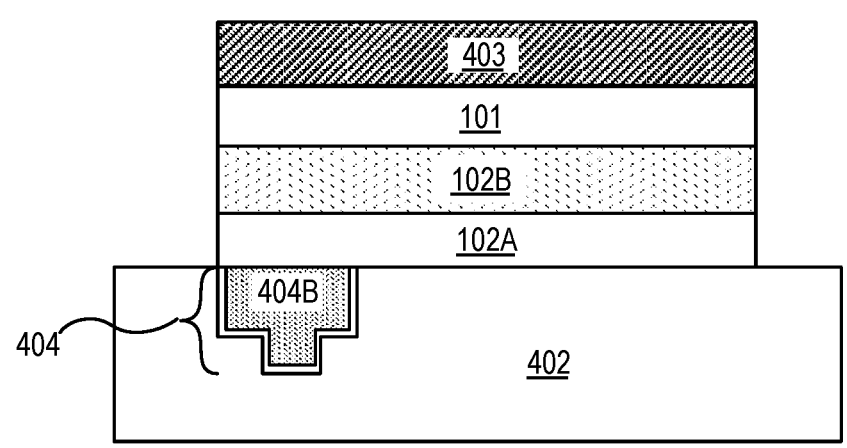
FIG. 4C illustrates a cross-sectional view of the structure in FIG. 4B following patterning of the electrode layer to form an electrode including then SOT material.

FIG. 4C illustrates a cross-sectional view of the structure in FIG. 4B following the patterning of the electrode layer 409 to form an SOT electrode 101 and seed structure 102, where the seed structure 102 includes patterned seed layer 102A and seed layer 102B formed on seed layer 102A. In an embodiment, the electrode layer 409 is patterned by a plasma etch process selectively to the mask 403.

Figure 4D:
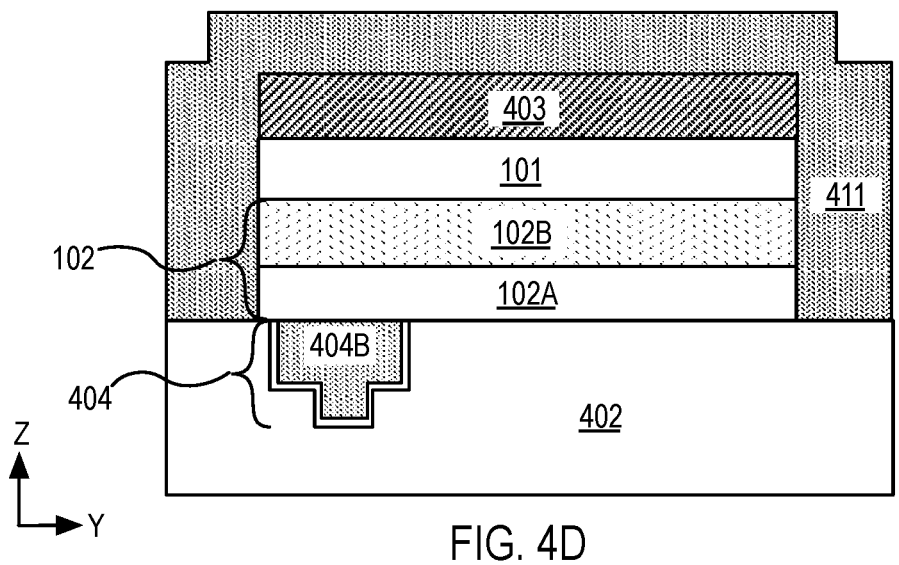
FIG. 4D illustrates a cross-sectional view of the structure in FIG. 4C following the deposition of a dielectric layer on the electrode.

FIG. 4D illustrates a cross-sectional view of the structure in FIG. 4C following the formation of a dielectric layer 411 on an uppermost surface of the mask 403, on portions of the dielectric layer 402, on sidewalls of the mask 403, adjacent to sidewalls of the SOT electrode 101 and sidewalls of seed structure 102. The dielectric layer 411 may be formed by a PECVD deposition process. In some examples, the dielectric layer 411 may include a material that is substantially the same as the material of the dielectric layer 402. In some examples the PECVD deposition process may include a blanket deposition of the dielectric layer 411.

Figure 4E:
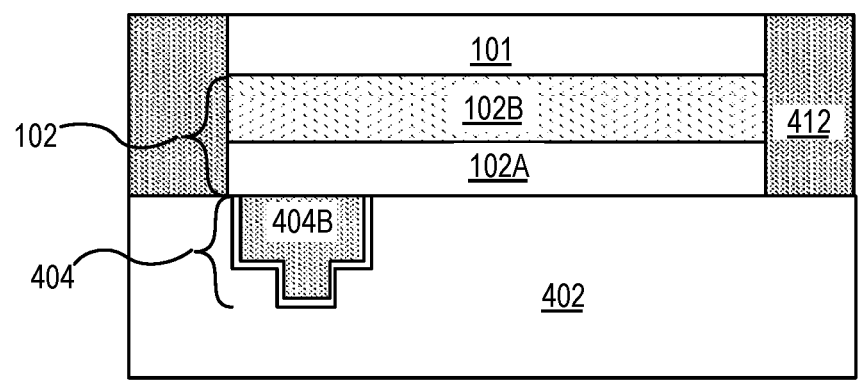
FIG. 4E illustrates a cross-sectional view of the structure in FIG. 4C following the planarization of the dielectric layer and the mask.

FIG. 4E illustrates a cross-sectional view of the structure in FIG. 4C following a planarization process. A planarization process is carried out, for example, to remove the dielectric layer 411 above the mask 403 and continued until almost all of the mask 403 is removed. The portions of the of dielectric layer 411 remaining after the planarization process forms an isolation 412 adjacent to the SOT electrode 101 and the seed structure 102. In an embodiment, the planarization process further removes an upper portion of the SOT electrode 101. In other embodiments, a thin portion of dielectric layer 411 left on the SOT electrode 101 after the planarization is removed by a wet chemical removal method. In an embodiment, the SOT electrode 101 and the isolation 412 surrounding the SOT electrode 101 have uppermost surfaces that are substantially co-planar following the planarization process. The planarization process may include a chemical mechanical polish process. In an example, a planarization process that removes all of the dielectric layer 411 above the SOT electrode 101, may form an SOT electrode 101 having a topographically smooth uppermost surface with a surface roughness that is less than 1 nm. In an embodiment, the SOT electrode 101 has a resultant thickness between 2 m-10 nm after the planarization process.

Figure 4F:
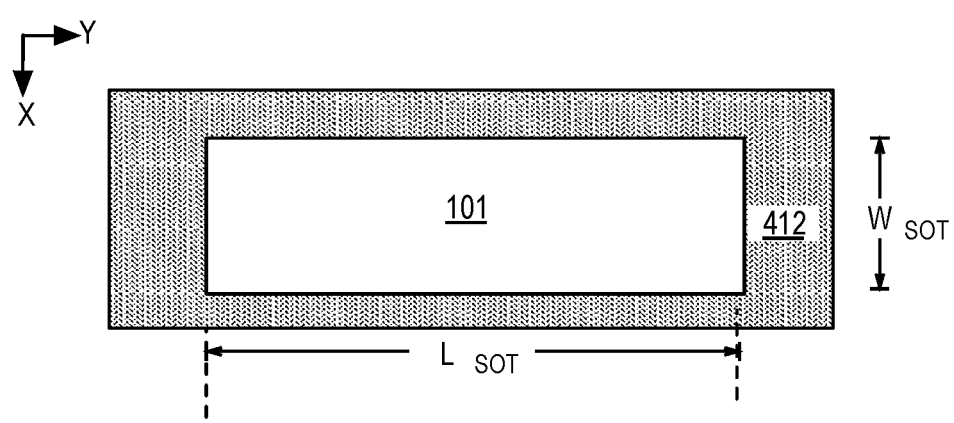
FIG. 4F illustrates a plan view of the structure in FIG. 4E depicting a shape of the electrode including the SOT material.

FIG. 4F illustrates a plan view of the SOT electrode 101 illustrated in FIG. 4E. In the illustrative embodiment, the SOT electrode 101 is rectangular. In other embodiments, the SOT electrode 101 is elliptical or circular. A rectangular SOT electrode 101, as depicted, has a length $L_{SOT}$ and a width $W_{SOT}$. In some embodiments, the SOT electrode 101 has a length, $L_{SOT}$, that is between 50 nm to 500 nm. In some embodiments, the SOT electrode 101 has a width, $W_{SOT}$, between 20 nm to 40 nm. In other embodiments, the SOT electrode 101 is square shaped (not shown).

Figure 4G:
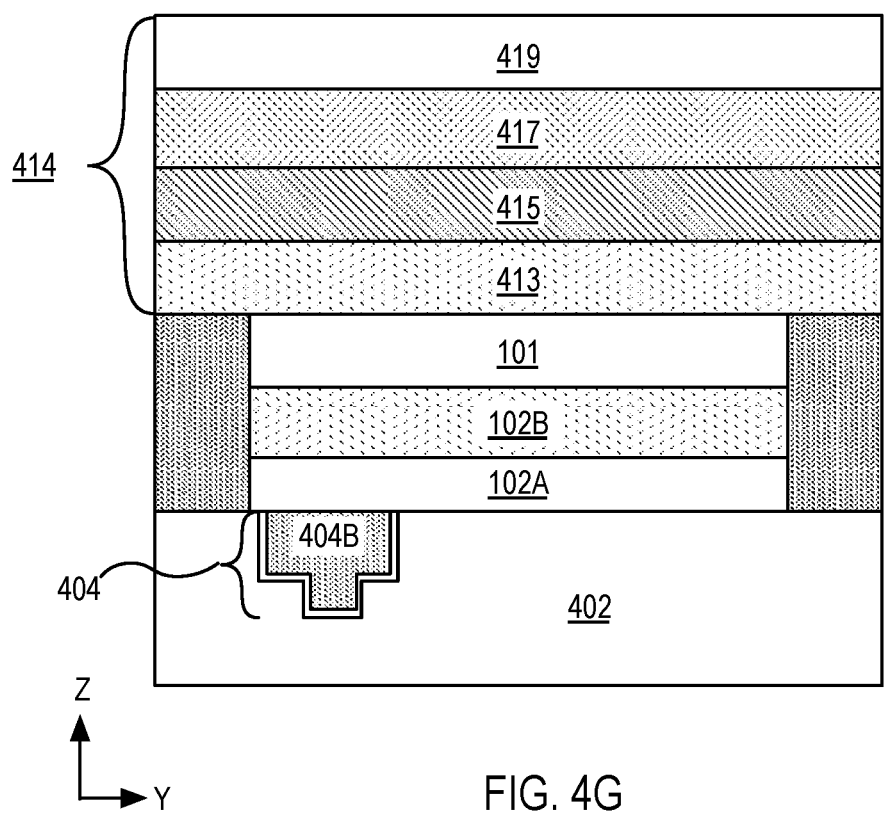
FIG. 4G illustrates a cross-sectional view of the structure in FIG. 4E following the formation of a free magnet structure including a magnetic enhancement layer on the electrode and on the dielectric layer.

FIG. 4G illustrates a cross-sectional view of the structure in 4E following the formation of a magnetic stability enhancement layer 413 on the SOT electrode 101, a ferromagnetic layer 415 on the magnetic stability enhancement layer 413, a conductive spacer layer 417 on the ferromagnetic layer 415 and a free magnetic layer 419 on the conductive spacer layer 417 to form a composite free magnetic layer 414 on the SOT electrode 101 and on the isolation 412. In some embodiments, the formation of the composite free magnetic layer 409 includes blanket depositing a magnetic stability enhancement layer 413 on the SOT electrode 101 and on the dielectric layer 102, followed by blanket depositing a ferromagnetic layer 415 on the magnetic stability enhancement layer 413, followed by blanket depositing a conductive spacer layer 417 on the ferromagnetic layer 415 and followed by blanket depositing a free magnetic layer 419 on the conductive spacer layer 417.

In some embodiments, the deposition process is carried without an air break and the individual layers are blanket deposited using a variety of deposition processes in a cluster tool. Some layers may be deposited using a physical vapor deposition (PVD) process, for example. Other examples of deposition processes may include a co-sputter or a reactive sputtering process to deposit various layers of the composite free magnetic layer 414.

In an embodiment, the magnetic stability enhancement layer 413 is deposited by a physical vapor deposition (PVD) process. In some embodiments, the magnetic stability enhancement layer 413 includes a material that is the same or substantially the same as the composition and material of the magnetic stability enhancement structure 206. In some embodiments, the magnetic stability enhancement layer 413 includes a multilayer stack of alternating layers of magnetic layer 206A and a non-magnetic layer 206B, starting with a magnetic layer 206A, as is described in association with FIG. 2B. In some such embodiments, the magnetic layer 206A is in contact with the SOT electrode 101. When the magnetic layer 206A, including a metal, such as cobalt or nickel, is deposited on the SOT electrode 101 including an antiferromagnetic IrMn, an exchange bias may be formed in magnetic stability enhancement layer 413 at an interface 406 between the magnetic stability enhancement layer 413 and the SOT electrode 101. Such an exchange bias may be formed during an anneal process to be described further below. In one embodiment, the non-magnetic layer 206B may include a metal, such as platinum, palladium or iridium. As deposited the magnetic stability enhancement layer 413 is formed to have perpendicular anisotropy.

The ferromagnetic layer 415 deposited on the magnetic stability enhancement layer 413 may include a material that is the same or substantially the same as the material of the ferromagnetic layer 207. The conductive spacer layer 417 deposited on the ferromagnetic layer 415 may include a material that is the same or substantially the same as the material of the conductive spacer 208. The free magnetic layer 419 deposited on the conductive spacer layer 417 may include a material that is the same or substantially the same as the material of the free magnet 209. The layers deposited to form composite free magnetic layer 414 ferromagnetically coupled together to act a single magnet during a switching event. In an exemplary embodiment, the ferromagnetic layer 415 includes cobalt, the conductive spacer layer 417 includes tantalum and the free magnetic layer 419 includes a CoFeB that is amorphous as deposited. In an embodiment, the free magnetic layer 417 is deposited to a thickness between 0.9 nm-2.0 nm to fabricate a perpendicular MTJ device.

Figure 4H:
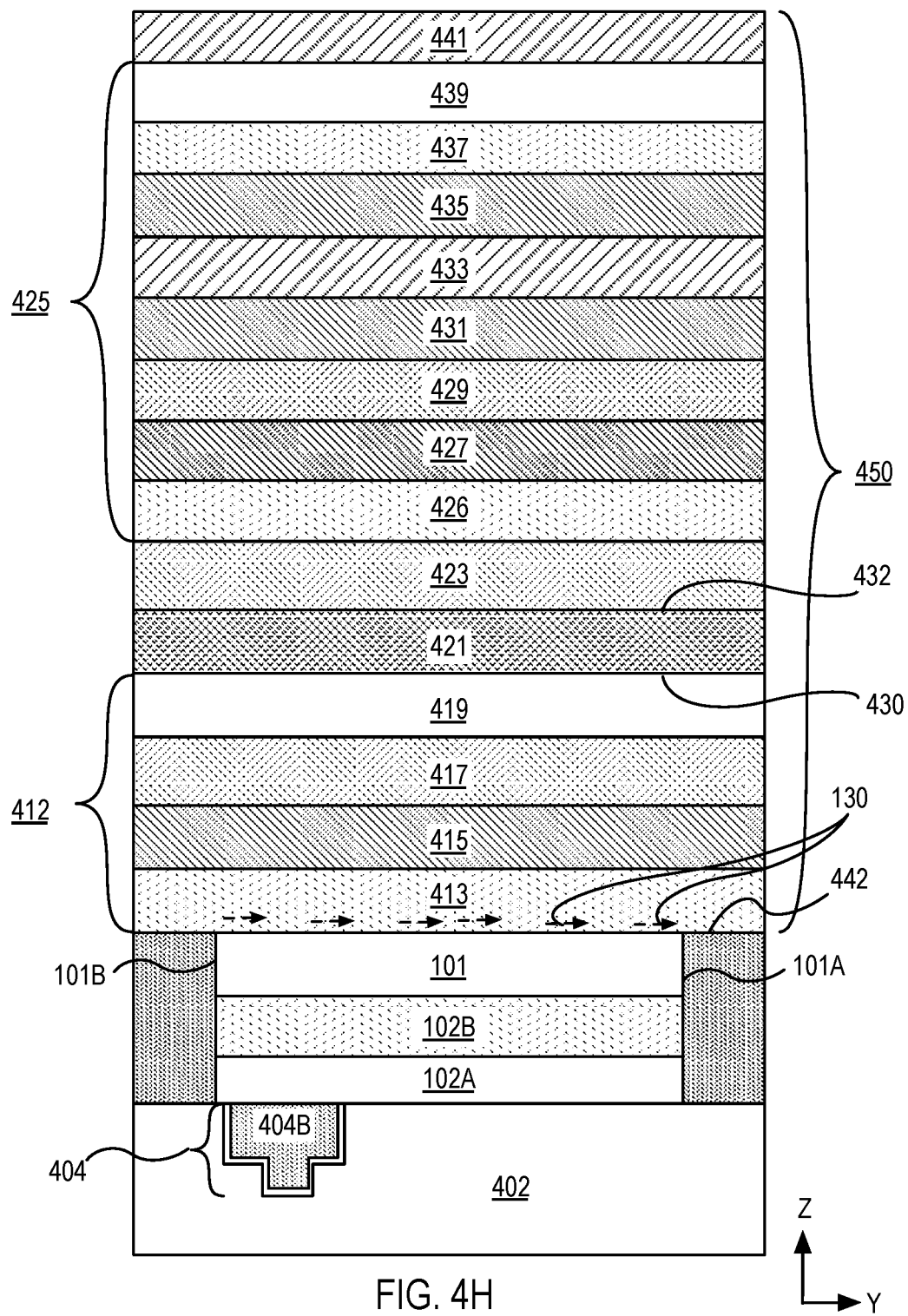
FIG. 4H illustrates a cross-sectional view of the structure in FIG. 4G following the formation of a tunnel barrier layer, a fixed magnetic layer, a SAF structure, and a capping electrode layer to form a material layer stack for a magnetic tunnel junction device.

FIG. 4H illustrates a cross-sectional view of the structure in FIG. 4G following the formation of a tunnel barrier layer 421 on the free magnetic layer 419, a fixed magnetic layer 423 on the tunnel barrier layer 421, SAF structure 425 on the fixed magnetic layer 423 and an electrode layer 441 on the SAF structure 425 to complete formation of a material layer stack 450 for a pMTJ device.

In some embodiments, a tunnel barrier layer 421 is blanket deposited on the free magnetic layer 419. In an embodiment, the tunnel barrier layer 421 includes a material, such as MgO or $Al_2O_3$. In an exemplary embodiment, the tunnel barrier layer 421 is an MgO and is deposited using a reactive sputter process. In an embodiment, the reactive sputter process is carried out at room temperature. In an embodiment, the tunnel barrier layer 421 is deposited to a thickness between 0.8 nm to 1 nm. In an embodiment, the deposition process is carried out in a manner that yields a tunnel barrier layer 421 having an amorphous structure. In some examples, the amorphous tunnel barrier layer 421 becomes crystalline after a high temperature anneal process to be described further below. In other embodiments, the tunnel barrier layer 421 is crystalline as deposited.

In an embodiment, the fixed magnetic layer 423 is blanket deposited on an uppermost surface of the tunnel barrier layer 421. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 423 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnetic layer 423 includes a material that is the same or substantially the same as the material of the fixed magnet 116 described above. In some examples, the fixed magnetic layer 423 may be deposited to a thickness between 1.0 nm and 3.0 nm.

The process is continued with deposition of layers utilized to form a SAF structure 425. In some embodiments, the layers utilized to form SAF structure 425 are blanket deposited on the fixed magnetic layer 421 using a PVD process. The layers utilized to form SAF structure 425 are the same or substantially the same as the layers in the SAF structure 218 described above.

In some embodiments, the process utilized to deposit all layers of the material layer stack 450, illustrated in FIG. 4H, is carried without an air break. The individual layers may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process. In the illustrative embodiment, formation of the SAF structure 425 includes blanket depositing a non-magnetic spacer layer 426 on the fixed magnetic layer 423. In some embodiments, the non-magnetic spacer layer 426 includes a material that is the same or substantially the same as the material of the non-magnetic spacer 220.

Formation of the SAF structure 425 further includes formation of a magnetic structure 427 including a multilayer stack of alternating layers of magnetic and non-magnetic materials above the non-magnetic spacer layer 426. In some embodiments, the magnetic structure 427 includes a structure having layers and materials that are the same or substantially the same as the layers and materials of the magnetic structure 222. A magnetic layer 429 is then deposited on the magnetic structure 427. In some embodiments, the magnetic layer 429 includes a material that is the same or substantially the same as the material of the magnetic layer 224. A non-magnetic spacer layer 431 is then deposited on the magnetic layer 429. In some embodiments, the non-magnetic spacer layer 431 includes a material that is the same or substantially the same as the material of the non-magnetic spacer 226. The deposition process is continued with a blanket deposition of a magnetic layer 433 on the non-magnetic spacer layer 431. In some embodiments, the magnetic layer 433 includes a material that is the same or substantially the same as the material of the magnet 228. A non-magnetic spacer layer 435 is then blanket deposited on the magnetic layer 433. In one embodiment, the non-magnetic spacer layer 435 includes a material that is the same or substantially the same as the material of the non-magnetic spacer 230.

Formation of the SAF structure 425 further includes formation of a magnetic structure 437 including a multilayer stack of alternating layers of magnetic and non-magnetic materials on the non-magnetic spacer layer 437, followed by a blanket deposition of a non-magnetic spacer layer 439 on the magnetic structure 437. In some embodiments, the magnetic structure 437 includes a multilayer stack having layers and materials that are the same or substantially the same as the layers and materials of the magnetic structure 232 (described in association with FIGS. 2A and 2D). In some embodiments, the non-magnetic spacer layer 439 includes a material that is the same or substantially the same as the material of the non-magnetic spacer 234.

In an embodiment, the deposition process concludes with a blanket deposition of an electrode layer 441 on an uppermost surface of the SAF structure 425. In an embodiment, the electrode layer 441 includes a material that is suitable to act as a hardmask during a subsequent etching of the pMTJ material layer stack 450 to form a pMTJ device on the SOT electrode 101. In an embodiment, the electrode layer 441 includes a material such as TiN, Ta or TaN. In an embodiment, the thickness of the top electrode layer ranges from 5 nm and 70 nm. The thickness of the electrode layer 441 is chosen to accommodate patterning of the pMTJ material layer stack 450 to form a pMTJ device.

In an embodiment, after all the layers in the pMTJ material layer stack 450 are deposited, an anneal is performed. In an embodiment, the anneal is performed immediately post deposition but before patterning of the pMTJ material layer stack 450. A post-deposition anneal of the pMTJ material layer stack 450 is carried out in a furnace in a forming gas environment. In an embodiment, the forming gas includes a mixture of $H_2$ and $N_2$ gas. When the anneal is carried out at a temperature below a Neel temperature of the material of SOT electrode 101, an in-plane exchange bias 130 may be established in the magnetic stability enhancement layer 413 at an interface 442 between the magnetic stability enhancement layer 413 and the SOT electrode 101. In some embodiments, an in-plane magnetic field is applied in a direction transverse to a surface of the electrode layer 441 during annealing. In an embodiment, the anneal temperature ranges between 300 and 350 degrees Celsius. In some embodiments, the anneal forms an in-plane exchange bias of at least 100 Oersted.

In an embodiment, the annealing process also promotes solid phase epitaxy of the free magnetic layer 419 to follow a crystalline template of the tunnel barrier layer 421 (e.g., MgO) that is directly above the free magnetic layer 419. In an embodiment, the anneal also promotes solid phase epitaxy of the fixed magnetic layer 423 to follow a crystalline template of the tunnel barrier layer 421 (e.g., MgO) that is directly below the fixed magnetic layer 423. <001> Lattice matching between the tunnel barrier layer 421 and the free magnetic layer 419 and <001> lattice matching between the tunnel barrier layer 421 and the fixed magnetic layer 423 enables a TMR ratio of at least 90% to be obtained in the pMTJ material layer stack 450.

In an embodiment, when the free magnetic layer 419 includes boron, the annealing process enables boron to diffuse away from an interface 430 between the free magnetic layer 419 and the tunnel barrier layer 421. The process of diffusing boron away from the interface 430 enables lattice matching between the free magnetic layer 419 and the tunnel barrier layer 421. In an embodiment, when the fixed magnetic layer 423 includes boron, the annealing process enables boron to diffuse away from an interface 432 between the fixed magnetic layer 423 and the tunnel barrier layer 421.

In an embodiment, the annealing process is also performed in the presence of a magnetic field which sets a direction of magnetization of the fixed magnetic layer 423, of the free magnetic layer 419, of the ferromagnetic layer 415 and of the magnetic stability enhancement layer 413. In an embodiment, during the annealing process, an applied magnetic field that is directed perpendicular to a plane of pMTJ material layer stack 450 enables a perpendicular anisotropy to be set in the fixed magnetic layer 423, in the free magnetic layer 419, in the ferromagnetic layer 415 and in the magnetic stability enhancement layer 413. In some embodiments, the magnetization of the free magnetic layer 419, the ferromagnetic layer 415 and the magnetization of the magnetic stability enhancement layer 413 are parallel to each other and perpendicular to the plane of the pMTJ material layer stack 450 after the annealing process.

Figure 4I:
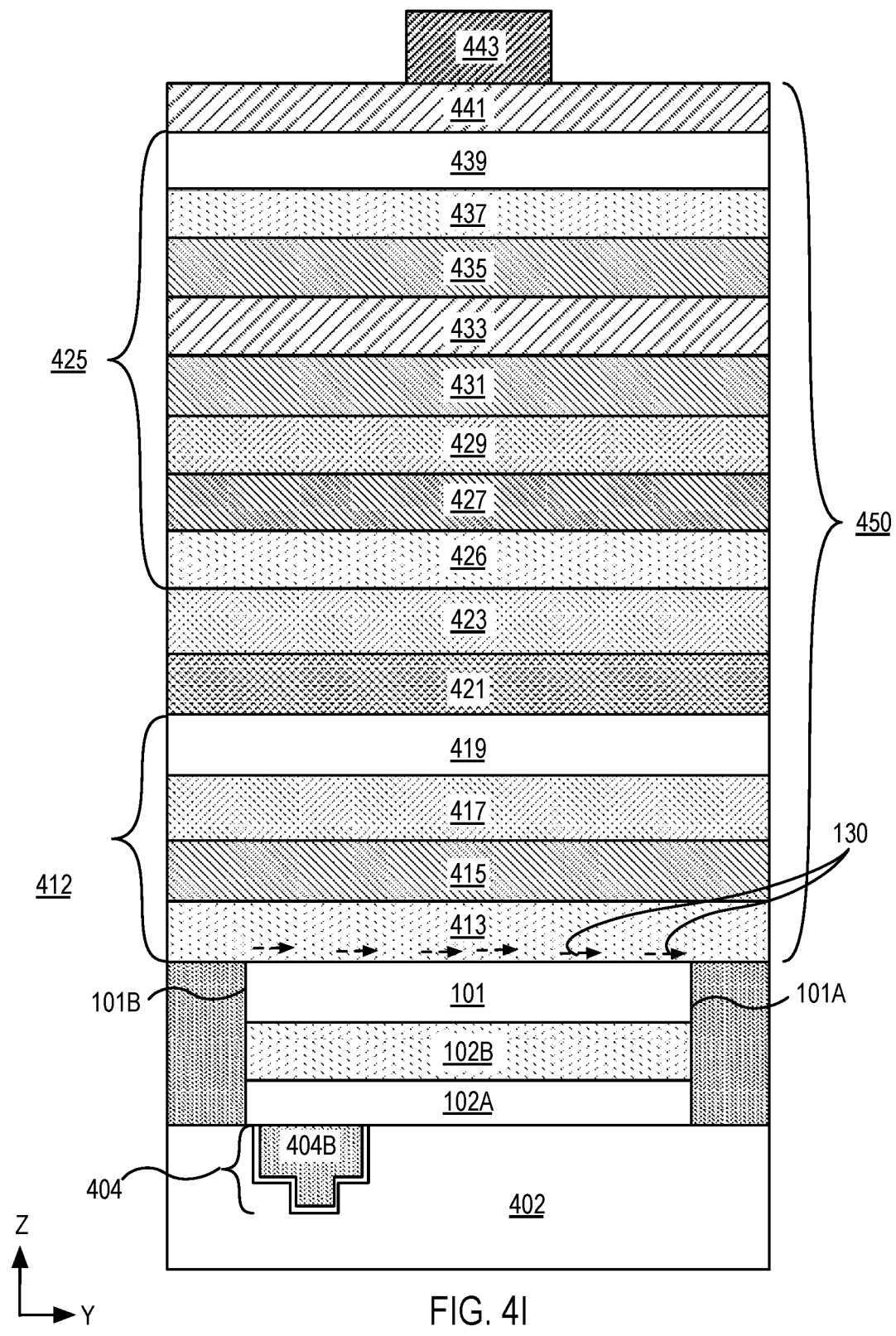
FIG. 4I illustrates a cross-sectional view of the structure in FIG. 4H following the process of forming a mask on the material layer stack for a magnetic tunnel junction device.

FIG. 4I illustrates a cross-sectional view of the structure in FIG. 4G following the formation of a mask 443 over the pMTJ material layer stack 450. In some embodiments, the mask 443 is formed by a lithographic process. In other embodiments, the mask 443 includes a dielectric material that has been patterned. The mask 443 defines a shape and size of a pMTJ device and a location where the pMTJ device is to be subsequently formed with respect the SOT electrode 101. In some embodiments, the mask 443 has a circular shape as is depicted in the plan view illustration of FIG. 1B. In the illustrative embodiment, the mask is formed on a plane above, but laterally away from the conductive interconnect 404. A mask formed approximately midway between sidewall 101A and sidewall 101B of the SOT electrode 101, for example, may lead to the formation of a pMTJ device that can be influenced by a spin current having a magnitude that is substantially independent of the direction of the charge current through the SOT electrode 101, as discussed above in association with FIGS. 3B-3C.

Figure 4J:
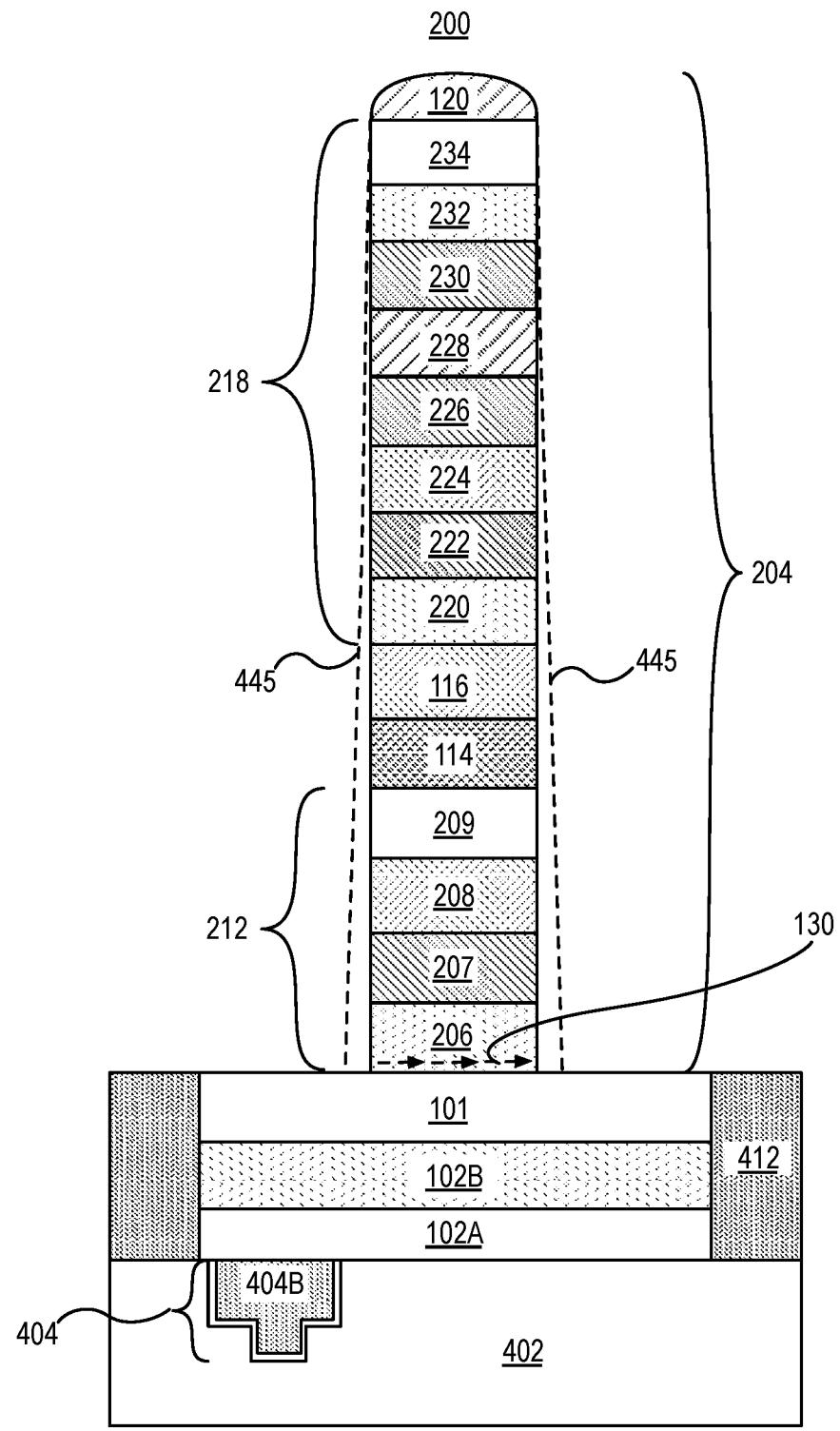
FIG. 4J illustrates a cross-sectional view of the structure in FIG. 4I following the process of etching the material layer stack to form a magnetic tunnel junction device on the electrode including the SOT material.

FIG. 4J illustrates a cross-sectional view of the structure in FIG. 4H following patterning and etching of the pMTJ material layer stack 450. In an embodiment, the patterning process first includes etching the electrode layer 441 by a plasma etch process to form an electrode 120. In an embodiment, plasma etch process possesses sufficient ion energy and chemical reactivity to render vertical etched sidewalls of the electrode layer 120. In an embodiment, the plasma etch process is then continued to pattern the remaining layers of the pMTJ material layer stack 450 to form a pMTJ device 204. The plasma etch process etches the various layers in the pMTJ material layer stack 450 to form a SAF structure 218, a fixed magnet 116, a tunnel barrier 114, a free magnet structure 212. The plasma etch process also exposes the SOT electrode 101 and the isolation 412. In some embodiments, depending on the etch parameters, the pMTJ device 204 may have sidewalls that are tapered during the etching process, as indicated by the dashed lines 445. The pMTJ device 204 formed over an SOT electrode 101, coupled with a conductive interconnect 404 through the seed layers 102A and 102B, constitutes a perpendicular spin orbit torque memory device 200.

Figure 4K:
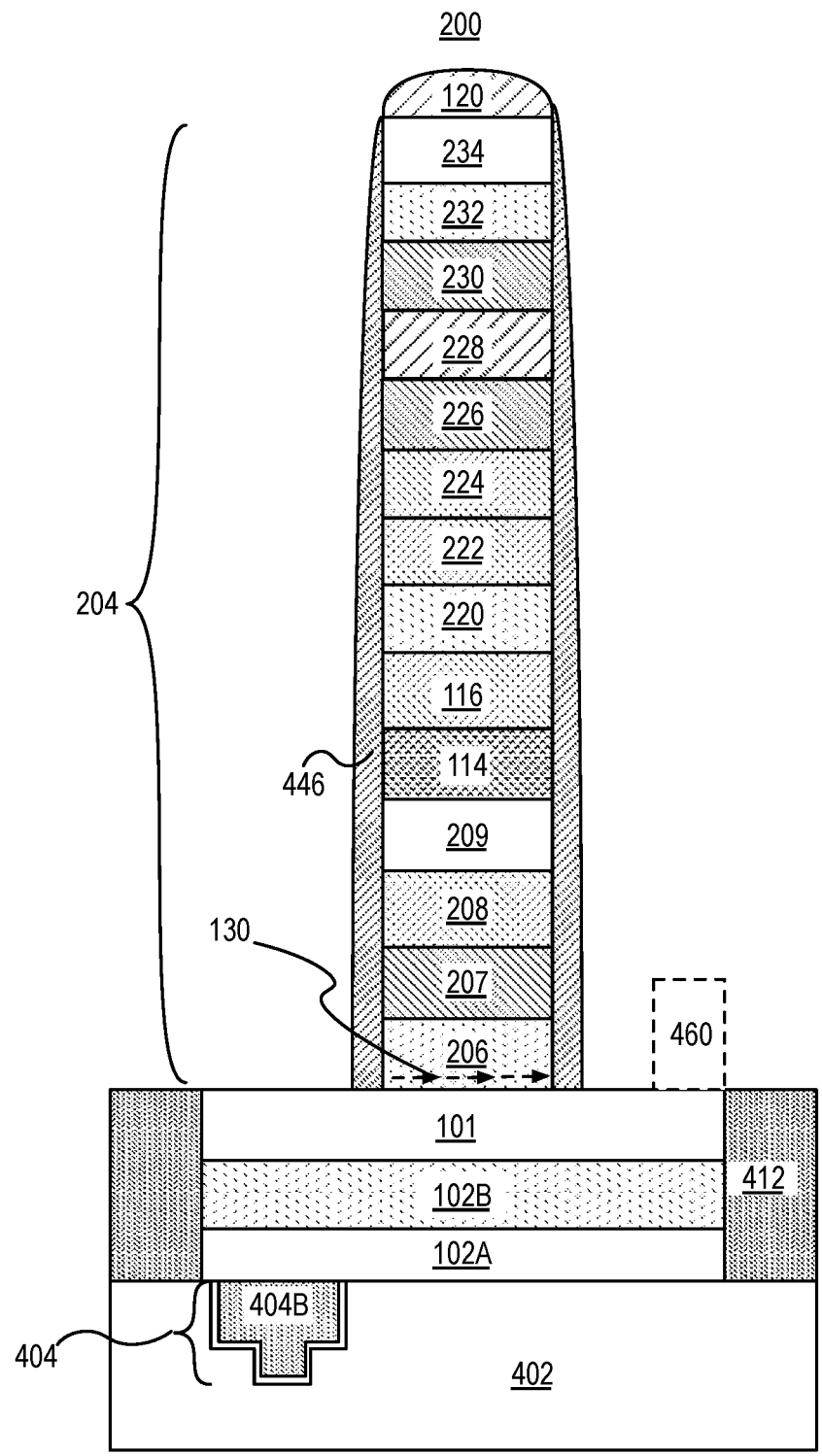
FIG. 4K illustrates a cross-sectional view of the structure in FIG. 4J following the formation of a dielectric spacer adjacent to the magnetic tunnel junction device and on portions of the electrode.

FIG. 4K illustrates a cross-sectional view of the structure in FIG. 4I following the formation of a dielectric spacer 446 adjacent to the pMTJ device 204. In an embodiment, a dielectric spacer layer is deposited on the pMTJ device 204 and on the uppermost surface of the SOT electrode 101 and on the isolation 412. In an embodiment, the dielectric spacer layer is deposited without a vacuum break following the plasma etch process utilized to form the pMTJ device 204. In other embodiments the spacer layer is blanket deposited by a PECVD deposition process. The dielectric spacer layer may also be deposited using a PVD or a PECVD deposition process. In some embodiments, the dielectric spacer layer includes a material such as, but not limited to, silicon nitride (e.g., comprising predominantly silicon and nitrogen), carbon doped silicon nitride (e.g., comprising predominantly silicon and nitrogen and a minor faction of carbon), or silicon carbide (e.g., comprising predominantly silicon and carbon). The dielectric spacer layer may include an insulator layer that does not have an oxygen content to minimize potential oxidation of magnetic layers. After blanket deposition dielectric spacer layer is etched by a plasma etch process forming dielectric spacer 446 on sidewalls of the pMTJ device 204. In some examples, the etch process may cause an uppermost portion of the isolation 412 to become partially recessed leading to partial exposure of sidewalls of the SOT electrode 101. Exposed sidewalls of the SOT electrode 101 may be covered with further dielectric material during subsequent processing operations.

A second conductive interconnect structure 460 (dashed lines in FIG. 4K) may be formed on the SOT electrode 101 after formation of the dielectric spacer 446. The second conductive interconnect structure 460 may have one or more features of the conductive interconnect 404. The conductive interconnect 460 is laterally spaced apart from the conductive interconnect 404 at an opposite end of the SOT electrode 101. In exemplary embodiments, the pMTJ device 204 is between the conductive interconnect 404 and conductive interconnect 460. It is to be appreciated that conductive interconnect 460 may also be formed at the same time as conductive interconnect 404 on a same plane as the conductive interconnect 404.

Figure 5:
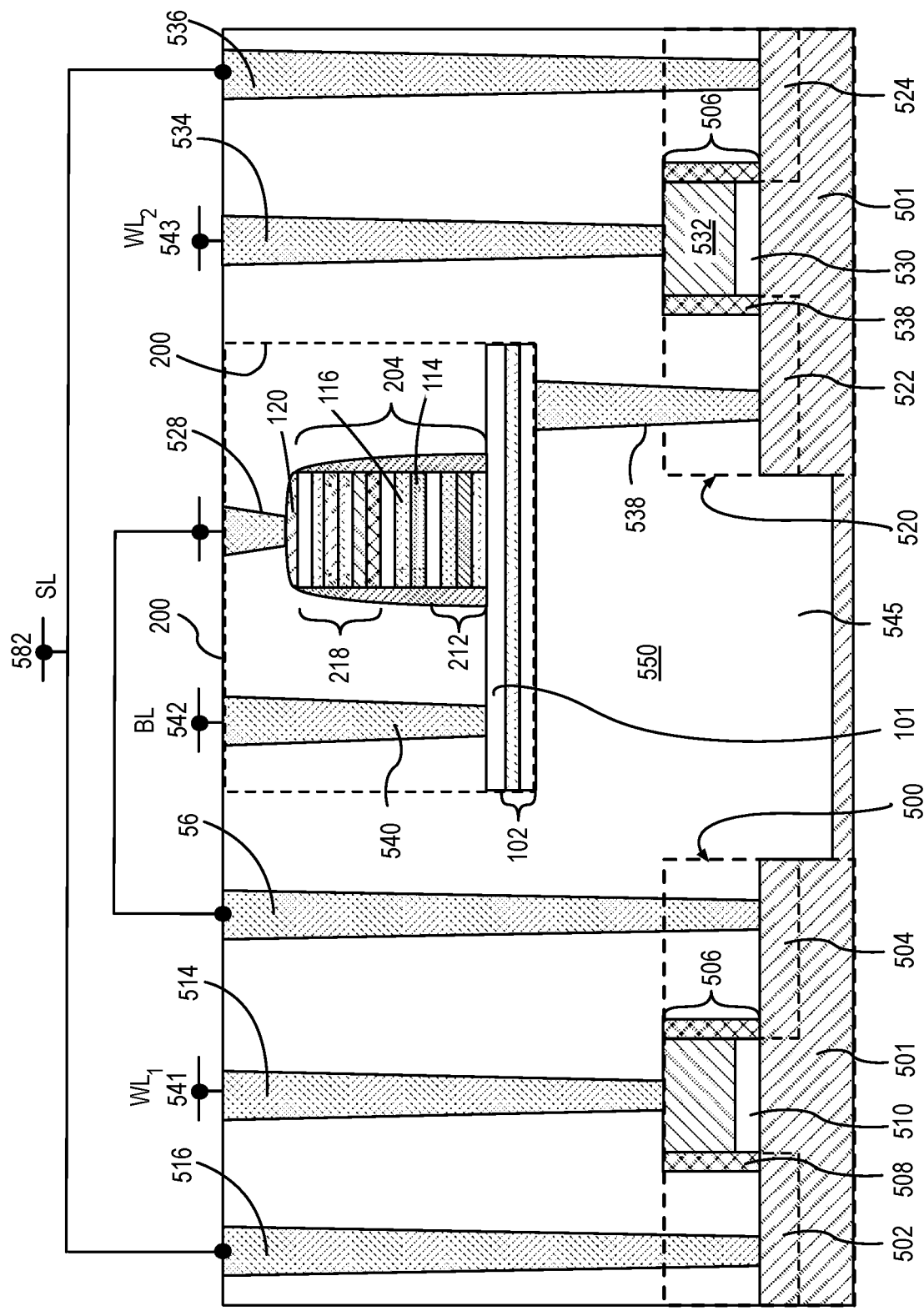
FIG. 5 illustrates a cross-sectional view of a SOT memory device having one terminal coupled to a first transistor, a second terminal coupled to a second transistor, and a third terminal coupled to a bit line.

FIG. 5 illustrates a spin orbit torque (SOT) memory device, such as the spin orbit torque memory device 100 having one terminal coupled with a first transistor 500 and a second transistor 520 and a bit line 542. In an embodiment, the first transistor 500 and second transistor 520 are on a substrate 501.

In an embodiment, the first transistor 500 and second transistor 520 associated with substrate 501 are metal-oxide-semiconductor field-effect transistors (MOSFET or simply MOS transistors), fabricated on the substrate 501. In various implementations of the present disclosure, the transistor 508 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the first transistor 500 and second transistor 520 are tri-gate transistors that are horizontally disposed on a same plane as illustrated in FIG. 5. The first transistor 500 and second transistor 520 are electrically isolated by a dielectric layer 545 although they are formed on a common substrate 501.

In an embodiment, the first transistor 500 has a source region 502, a drain region 504 and a gate 506. The first transistor 500 further includes a gate contact 514 above and electrically coupled to the gate 506, a source contact 516 above and electrically coupled to the source region 502, and a drain contact 518 above and electrically coupled to the drain region 504 as is illustrated in FIG. 5. In an embodiment, the second transistor 520 has a source region 524, a drain region 522 and a gate 526. The second transistor 520 further includes a gate contact 534 above and electrically coupled to the gate 526, a source contact 536 above and electrically coupled to the source region 524, and a drain contact 538 above and electrically coupled to the drain region 522 as is illustrated in FIG. 5.

In an illustrative embodiment, the pSOT device 200 includes a pMTJ device such as an pMTJ device 204 on an SOT electrode 101, as described in association with FIGS. 1A and 2A. In an embodiment, the SOT electrode 101 is adjacent to dielectric layer 550. In an embodiment, the pSOT memory device 200 includes a seed structure 102 between and in contact with the first SOT electrode 101 and the drain contact 538. The pSOT memory device 200 includes MTJ device 204 on SOT electrode 101 that includes Ir—Mn. The MTJ device 200 includes a composite free magnet 212, a tunnel barrier 114 having a material such as an MgO or $Al_2O_3$ on the free magnet 212, a fixed magnet 116 on the tunnel barrier 114, a SAF structure 218 on the fixed magnet 116 and an electrode 120 on the SAF structure 218. The Ir—Mn in SOT electrode 101, for example, has a face centered tetragonal crystal structure. In the illustrative embodiment, the SOT electrode 101 is antiferromagnetic and the composite free magnet 212 has a ferromagnetic structure, and the interface between the SOT electrode 101 and the lowermost most layer in the composite free magnet 212 has an in-plane exchange bias. In some embodiments, the exchange bias is in the range of 100-500 Oersted. A composite free magnet 212 such as described above has a plurality of interfaces that has thermal stability above 40 kT, and a TMR ratio of at least 90%. The seed structure 102 may have a sheet resistance at least two times greater than a sheet resistance of the anti-ferromagnetic spin orbit torque material. In embodiments, the thickness of the sheet metal is less than a thickness of the SOT electrode 101 to provide a higher sheet resistance compared to a sheet resistance of the SOT electrode 101.

In an illustrative embodiment, a portion of the SOT electrode 101 is in electrical contact with the drain contact 538 of the second transistor 520. A pMTJ contact 528 is on and electrically coupled with the pMTJ device 104. An interconnect metallization structure 540 is on and electrically coupled with the SOT electrode 101. In the illustrative embodiment, the pMTJ device 104 is laterally between the drain contact 538 and the interconnect metallization structure 540. In some embodiments, the pMTJ device 104 is laterally closer to the drain contact 538 than to interconnect metallization structure 540. In other embodiments, the pMTJ device 104 is laterally closer to the interconnect metallization structure 540 than to the drain contact 538. In some embodiments, the pMTJ device 104 is approximately midway, laterally, between the interconnect metallization structure 540 and the drain contact 538.

In the illustrative embodiment, the spin orbit contact 540 is connected to a bit line (BL) 542 of a memory array. In an embodiment, the BL 542 is connected to a spin orbit torque contact of a second spin orbit torque memory device (not shown). In an embodiment, the MTJ contact 528 is electrically connected to a drain contact 518 of the first transistor 500 (indicated by the dashed line 580). In an embodiment, the pMTJ contact 528, when connected to the drain contact 518, of the first transistor 500, enables flow of an STTM device current through the pMTJ device 104. In an embodiment, the source contact 516 of the first transistor and the source contact 536 of the second transistor 520 are electrically connected to a shared source line (SL) 582. In an embodiment, the gate contact 514 of the first transistor 500 is electrically connected to a first word line (WL$_1$) 541 and the gate contact 534 of the second transistor 520 is electrically connected to a second word line (WL$_2$) 543, where WL$_1$ 541 and WL$_2$ 543 are independently programmable.

In an embodiment, when the second transistor 520 is energized in a manner that causes charge current to flow through the SOT electrode 101, a spin hall current is generated in the SOT electrode 101. Generation of spin hall current in an electrode such as SOT electrode 101 is described above in association with FIGS. 3B-C. The spin hall current will exert a torque on the magnetization of a free magnet 106 of the pMTJ device 104. In an embodiment, torque transfer from the spin hall current will change the direction of magnetization in the free magnet 106. In an embodiment, by appropriately biasing the first transistor 500 and the second transistor 520, write and erase operations may be enabled in the MTJ memory device. A read operation of the pMTJ device 104 may be enabled by applying a biasing voltage between 0.1V-0.2V between the SL 582 and the BL 542 and by applying an appropriate gate voltage bias on WL$_2$ 543, to energize the first transistor 520.

Referring again to FIG. 5, in an embodiment, the underlying substrate 501 represents a surface used to manufacture integrated circuits. In an embodiment, the substrate 501 includes a suitable semiconductor material such as but not limited to, single crystal silicon, polycrystalline silicon and silicon on insulator (SOI). In another embodiment, the substrate 501 includes other semiconductor materials, such as germanium, silicon germanium, or a suitable group III-V or group III-N compound. The substrate 501 may also include semiconductor materials, metals, dopants, and other materials commonly found in semiconductor substrates.

In an embodiment, the first transistor 500 includes a gate stack formed of at least two layers, a gate dielectric layer 510 and a gate electrode layer 512. The gate dielectric layer 510 may include one layer or a stack of layers. The one or more layers may include silicon oxide, silicon dioxide (SiO$_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 510 to improve its quality when a high-k material is used.

The gate electrode layer 512 of the first transistor 500 is formed on the gate dielectric layer 510 and may consist of at least one P-type workfunction metal or N-type workfunction metal, depending on whether the transistor is to be a PMOS or an NMOS transistor. In some implementations, the gate electrode layer 512 may consist of a stack of two or more metal layers, where one or more metal layers are workfunction metal layers and at least one metal layer is a conductive fill layer.

For a PMOS transistor, metals that may be used for the gate electrode layer 512 include, but are not limited to, ruthenium, palladium, platinum, cobalt, nickel, and conductive metal oxides, e.g., ruthenium oxide. A P-type metal layer will enable the formation of a PMOS gate electrode layer 512 with a workfunction that is between about 4.9 eV and about 5.2 eV. For an NMOS transistor, metals that may be used for the gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 512 with a workfunction that is between about 3.9 eV and about 4.2 eV.

In some implementations, the gate electrode layer 512 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode layer 512 may simply be a planar layer that is substantially parallel to the top surface of the substrate and does not include sidewall portions substantially perpendicular to the top surface of the substrate. In further implementations of the present disclosure, the gate electrode layer 512 may consist of a combination of U-shaped structures and planar, non-U-shaped structures. For example, the gate electrode layer 512 may consist of one or more U-shaped metal layers formed atop one or more planar, non-U-shaped layers.

In some implementations of the present disclosure, a pair of gate dielectric layer 510 may be formed on opposing sides of the gate stack that bracket the gate stack. The gate dielectric layer 510 may be formed from a material such as silicon nitride, silicon oxide, silicon carbide, silicon nitride doped with carbon, and silicon oxynitride. Processes for forming sidewall spacers 508 may include deposition and etching process operations. In an alternate implementation, sidewall spacers 508 may include a plurality of spacer pairs, for instance, two pairs, three pairs, or four pairs of sidewall spacers may be formed on opposing sides of the gate stack.

As may be well known, source region 502 and drain region 504 are formed within the substrate adjacent to the gate stack of the first transistor 500. The source region 502 and drain region 504 are generally formed using either an implantation/diffusion process or an etching/deposition process. In the former process, dopants such as boron, aluminum, antimony, phosphorous, or arsenic may be ion-implanted into the substrate to form the source region 502 and drain region 504. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 502 and drain region 504. In some implementations, the source region 502 and drain region 504 may be fabricated using a silicon alloy such as silicon germanium or silicon carbide. In some implementations the epitaxially deposited silicon alloy may be doped in-situ with dopants such as boron, arsenic, or phosphorous. In further embodiments, the source region 502 and drain region 504 may be formed using one or more alternate semiconductor materials such as germanium or a suitable group III-V compound. And in further embodiments, one or more layers of metal and/or metal alloys may be used to form the source region 502 and drain region 504.

In an embodiment, the second transistor 520 also includes a gate stack formed of at least two layers, a gate dielectric layer 530 and a gate electrode layer 532. In an embodiment, the second transistor 520 is similar or substantially similar to the first transistor 500. In an embodiment, the gate dielectric layer 530 and the gate electrode layer 532 of the second transistor 520 are substantially similar to the gate dielectric layer 510 and the gate electrode layer 512 of the first transistor 500.

Figure 6:
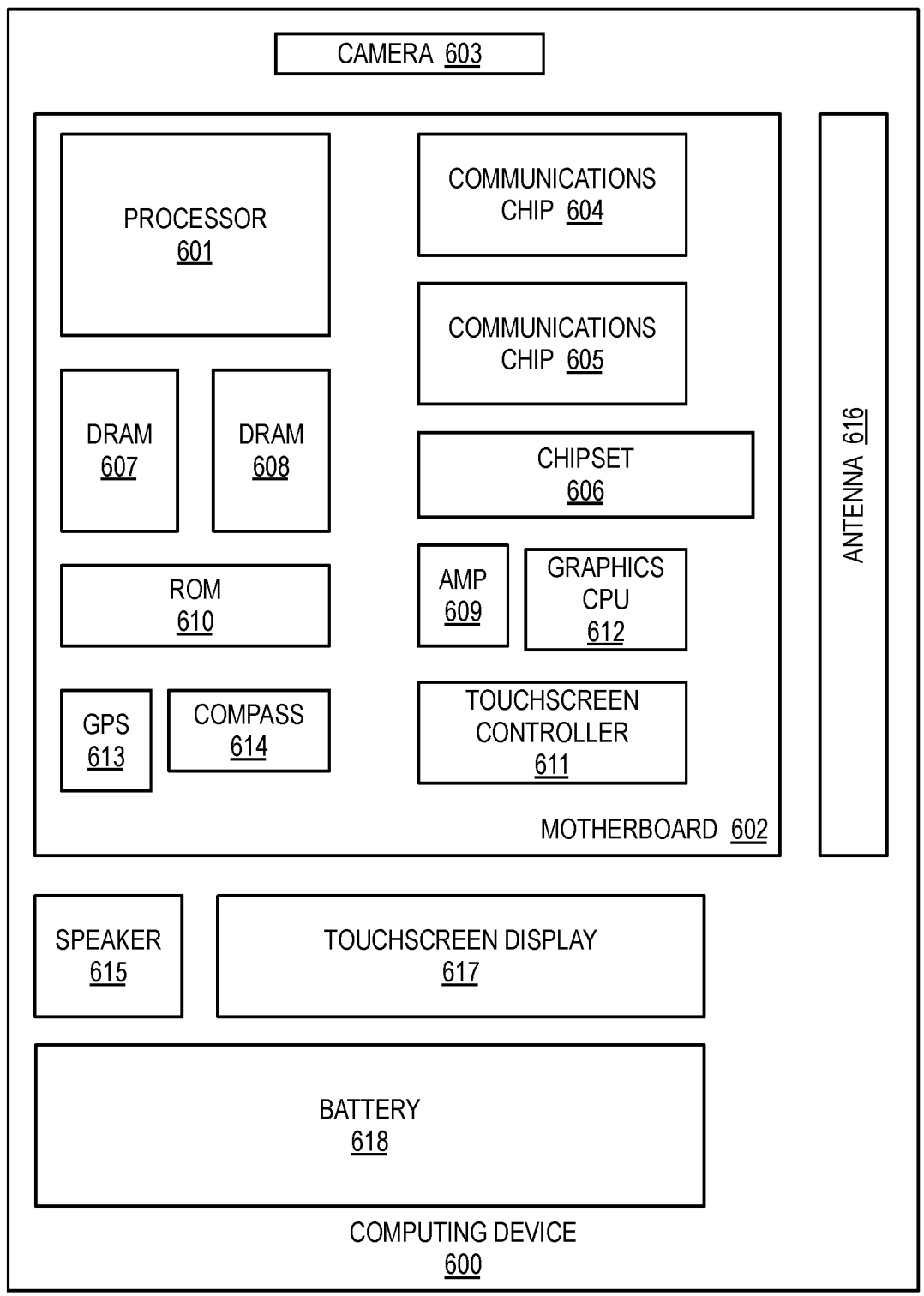
FIG. 6 illustrates a computing device in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communication chip 605. Processor 601 is physically and electrically coupled to the motherboard 602. In some implementations, communication chip 605 is also physically and electrically coupled to motherboard 602. In further implementations, communication chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 605 may implement any of a number of wireless standards or protocols, including but not limited to Wi-Fi (IEEE 802. 6 family), WiMAX (IEEE 802. 6 family), IEEE 802. 10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 604 and 605. For instance, a first communication chip 605 may be dedicated to shorter range wireless communications such as Wi-Fi and Bluetooth and a second communication chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes a transistor coupled with one at least one SOT memory device such as a SOT memory device 200 including a MTJ device 210 on a SOT electrode 201. The term "processor" may refer to any device or portion of a device that processes electronic data from registers and/or memory to transform that electronic data into other electronic data that may be stored in registers and/or memory.

Communication chip 605 also includes an integrated circuit die packaged within communication chip 606. In another embodiment, the integrated circuit die of communication chips 604, 605 include a memory array with memory cells including at least one pSOT memory device such as a pSOT memory device 200 including a MTJ device 204 on a SOT electrode 101.

In various examples, one or more communication chips 604, 605 may also be physically and/or electrically coupled to the motherboard 602. In further implementations, communication chips 604 may be part of processor 601. Depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics CPU 612, flash memory, global positioning system (GPS) device 613, compass 614, a chipset 606, an antenna 616, a power amplifier 609, a touchscreen controller 66, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of memory cells including at least one pSOT memory device such as a pSOT memory device 200 including a MTJ device 204 on a SOT electrode 101, built in accordance with embodiments of the present disclosure.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
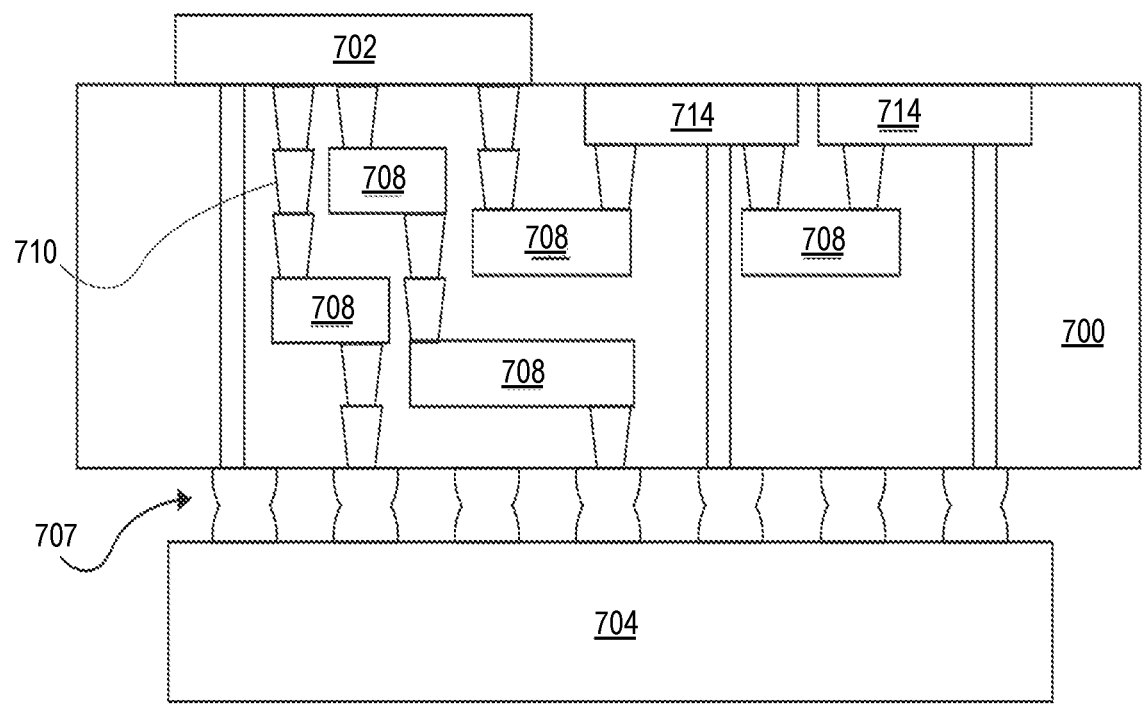
FIG. 7 illustrates an integrated circuit (IC) structure that includes one or more embodiments of the present disclosure.

FIG. 7 illustrates an integrated circuit (IC) structure 700 that includes one or more embodiments of the disclosure. The integrated circuit (IC) structure 700 is an intervening substrate used to bridge a first substrate 702 to a second substrate 704. The first substrate 702 may be, for instance, an integrated circuit die. The second substrate 704 may be, for instance, a memory module, a computer mother, or another integrated circuit die. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 706 that can subsequently be coupled to the second substrate 704. In some embodiments, the first and second substrates 702/704 are attached to opposing sides of the integrated circuit (IC) structure 700. In other embodiments, the first and second substrates 702/704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide.

In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 708 and vias 710, including but not limited to through-silicon vias (TSVs) 710. The integrated circuit (IC) structure 700 may further include embedded devices 714, including both passive and active devices. Such devices include, but are not limited to, capacitors, decoupling capacitors, resistors, inductors, fuses, diodes, transformers, device structure including transistors, such as transistors 500 and 520 coupled with a with one at least one SOT memory device such as a pSOT memory device 200, including an Ir—Mn SOT electrode coupled with a pMTJ device 204 having a TMR between 90%-110% and where the pSOT memory device 200 has an in-plane exchange bias at an interface between the pMTJ device 200 and the SOT electrode 101, (such as is described above in FIG. 2) for example. The integrated circuit (IC) structure 700 may further include embedded devices 714 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 700. In accordance with embodiments of the present disclosure, apparatuses or processes disclosed herein may be used in the fabrication of integrated circuit (IC) structure 700.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a pSOT memory device 200. The pSOT memory device 200 may be used in an embedded non-volatile memory application.

Thus, embodiments of the present disclosure include spin orbit torque memory devices with enhanced TMR and methods of fabrication.

Specific embodiments are described herein with respect to perpendicular spin orbit torque devices. It is to be appreciated that embodiments described herein may also be applicable to other non-volatile memory devices. Such non-volatile memory devices may include, but are not limited to, magnetic random-access memory (MRAM) devices, spin torque transfer memory (STTM) devices such as in-plane STTM or perpendicular STTM devices.

What is claimed is:

1. A perpendicular spin orbit torque (pSOT) device, comprising:
    a first electrode layer comprising iridium and manganese;
    a material layer stack adjacent to the first electrode layer, the material layer stack comprising:
        a free magnet comprising:
            a first free magnet layer of a first ferromagnetic composition;
            a plurality of bilayers between the first free magnet layer and the first electrode layer, each bilayer comprising a magnetic material layer of a second ferromagnetic composition, and a non-magnetic material layer;
            a second free magnet layer between the plurality of bilayers and the first free magnet layer; and
            a non-magnetic spacer layer between the first free magnet layer and the second free magnet layer;
        a fixed magnet; and
        a tunnel barrier between the free magnet and the fixed magnet; and
    a second electrode layer coupled with the fixed magnet.

2. The pSOT device of claim 1, wherein free magnet has a perpendicular magnetic anisotropy and wherein the first electrode layer and the free magnet have a magnetic exchange bias orthogonal to the perpendicular magnetic anisotropy.

3. The pSOT device of claim 1, wherein the magnetic exchange bias is in the range of 100-500 Oersted.

4. The pSOT device of claim 1, wherein the first electrode layer has a face centered tetragonal crystal structure.

5. The pSOT device of claim 1, wherein the first electrode layer has a thickness between 4 nm and 15 nm.

6. The pSOT device of claim 1, further comprising one or more seed layers, wherein the first electrode layer is between the free magnet and the one or more seed layers.

7. The pSOT device of claim 6, wherein the seed layers comprise a first seed layer comprising Ta, TaN or TiN, and a second seed layer on between the first seed layer and the first electrode layer, the second seed layer comprising Pt, Pd or Ir.

8. The pSOT device of claim 1, wherein the first ferromagnetic composition comprises cobalt, boron, and iron.

9. The pSOT device of claim 8, wherein the second free magnet layer has the second ferromagnetic composition wherein the plurality of bilayers comprises more than two bilayers.

10. The pSOT device of claim 1, wherein the non-magnetic spacer layer is Ta, W, Mo, or an alloy comprising Ta, W or Mo.

11. The pSOT device of claim 1, wherein the non-magnetic material layer in each of the plurality of bilayers comprises platinum, palladium or iridiunciand wherein the second ferromagnetic composition comprises cobalt or nickel.

12. The pSOT device of claim 1, further comprising a synthetic anti-ferromagnet (SAF) structure between the fixed magnet and the second electrode layer.

13. The pSOT device of claim 12, wherein the fixed magnet comprises cobalt, boron and iron the tunnel barrier comprises magnesium and oxygen, and the SAF comprises:
    a plurality of second bilayers, each second bilayer comprising a magnetic material layer and a non-magnetic material layer;
    a second non-magnetic spacer layer between the plurality of second bilayers and the fixed magnet;
    a plurality of third bilayers, each third bilayer comprising a magnetic material layer and a non-magnetic material layer;
    a third non-magnetic spacer layer between the plurality of third bilayers and the second electrode layer; and
    a fourth non-magnetic spacer layer between the second plurality of bilayers and the third plurality of bilayers.

14. The pSOT device of claim 13, wherein the first non-magnetic spacer layer is Ta, W, Mo, Ru or Jr or an alloy comprising Ta, W, Mo, Ru or Ir, wherein the second non-magnetic spacer layer is Ta, W, Mo, Ru or Jr or an alloy comprising Ta, W, Mo, Ru or Ir, wherein the third non-magnetic spacer layer comprises Ta, Ru, Pt, or Pd, and wherein the fourth non-magnetic spacer layer is Ta, W, Mo, Ru or Jr or an alloy comprising Ta, W, Mo, Ru or Ir.

15. A method of fabricating a perpendicular spin orbit torque (pSOT) device, the method comprising:

depositing a first electrode layer comprising iridium and manganese;

forming a material layer stack on the first electrode layer, the forming comprising:

depositing a plurality of bilayers over the first electrode layer, each bilayer comprising a magnetic material layer of a first ferromagnetic composition, and a non-magnetic material layer;

depositing a first free magnet layer over the plurality of bilayers;

depositing a non-magnetic spacer layer over the first free magnet layer;

depositing a second free magnet layer of a second ferromagnetic composition over the non-magnetic spacer layer;

depositing a tunnel barrier layer on over the second free magnet layer;

depositing a fixed magnetic layer over the tunnel barrier layer;

depositing a second electrode layer over the fixed magnetic layer; and etching the material layer stack to form a memory device over a portion of the first electrode layer.

16. The method of claim 15, wherein the first electrode layer has a tetragonal phase.

17. The method of claim 15, wherein the first electrode layer is deposited to a thickness of between 4 nm-15 nm.

18. The method of claim 15, wherein the method further includes performing an anneal at a temperature below a Neel temperature of the first electrode.

19. The method of claim 18, wherein the anneal is performed in a presence of an external magnetic field.

20. An apparatus comprising:

a transistor above a substrate, the transistor comprising:

a drain contact coupled to a drain;

a source contact coupled to a source;

a gate contact coupled to a gate; and the pSOT device of claim 1 coupled with the drain contact.

* * * * *